(12) United States Patent  (10) Patent No.: US 8,777,463 B2
Pickard et al.  (45) Date of Patent: Jul. 15, 2014

(54) HYBRID SOLID STATE EMITTER PRINTED CIRCUIT BOARD FOR USE IN A SOLID STATE DIRECTIONAL LAMP

(75) Inventors: Paul Pickard, Morrisville, NC (US); Curt Progl, Raleigh, NC (US)

(73) Assignee: Cree, Inc., Durham, NC (US)

( * ) Notice: Subject to any disclaimer, the term of this patent is extended or adjusted under 35 U.S.C. 154(b) by 264 days.

(21) Appl. No.: 13/167,387

(22) Filed: Jun. 23, 2011

(65) Prior Publication Data
US 2012/0327670 A1 Dec. 27, 2012

(51) Int. Cl.
F21V 21/00 (2006.01)

(52) U.S. Cl.
USPC .................... 362/382; 362/294; 362/373

(58) Field of Classification Search
CPC ........ F21S 48/328; F21V 7/20; F21V 29/004; F21V 19/001; F21V 19/003; F21V 19/0035; H05K 3/0058; H05K 3/0061
USPC ...................... 362/294, 373, 249.02, 800, 382
See application file for complete search history.

(56) References Cited

U.S. PATENT DOCUMENTS

| 4,630,182 | A | 12/1986 | Moroi et al. | |
|---|---|---|---|---|
| 6,414,801 | B1 | 7/2002 | Roller | |
| 6,805,474 | B2 * | 10/2004 | Walser et al. | 362/494 |
| D532,532 | S | 11/2006 | Maxik | |
| D544,110 | S | 6/2007 | Hooker et al. | |
| D566,300 | S | 4/2008 | Lo | |
| 7,360,925 | B2 | 4/2008 | Coushaine | |
| D581,555 | S | 11/2008 | To et al. | |
| D584,838 | S | 1/2009 | To et al. | |
| D610,722 | S | 2/2010 | Bi | |
| 7,654,688 | B2 * | 2/2010 | Li et al. | 362/240 |
| 7,777,430 | B2 | 8/2010 | Catalano et al. | |
| 7,794,115 | B2 * | 9/2010 | Hellinger et al. | 362/294 |
| 7,997,769 | B2 | 8/2011 | Foo | |
| 8,075,165 | B2 * | 12/2011 | Jiang et al. | 362/308 |
| D663,057 | S | 7/2012 | Pan | |
| D679,033 | S | 3/2013 | Dungan et al. | |
| 2003/0016536 | A1 | 1/2003 | Lin | |
| 2004/0114366 | A1 | 6/2004 | Smith et al. | |

(Continued)

FOREIGN PATENT DOCUMENTS

DE 10 2009 010213 8/2010
EP 1 371 901 12/2003

(Continued)

OTHER PUBLICATIONS

International Search Report and Written Opinion for PCT/US2012/042394, dated Sep. 17, 2012, 10 pages.

(Continued)

*Primary Examiner* — John A Ward
(74) *Attorney, Agent, or Firm* — Brinks Gilson & Lione

(57) ABSTRACT

An assembly for use in a solid state directional lamp is disclosed. The assembly includes a multilayer FR4 printed circuit board and a metal heat spreader assembled with the multilayer FR4 printed circuit board. The assembly is configured to mount a plurality of solid state light emitters. The multilayer FR4 printed circuit board defines an aperture and a least a portion of the metal heat spreader is positioned in the aperture of the multilayer FR4 printed circuit board. The portion of the heat spreader positioned in the aperture of the multilayer FR4 printed circuit board is in communication with heat dissipation means.

23 Claims, 32 Drawing Sheets

(56) References Cited

U.S. PATENT DOCUMENTS

| | | |
|---|---|---|
| 2004/0114393 A1 | 6/2004 | Galli |
| 2005/0111234 A1* | 5/2005 | Martin et al. ............ 362/555 |
| 2005/0219840 A1 | 10/2005 | Holder et al. |
| 2006/0109654 A1 | 5/2006 | Coushaine et al. |
| 2006/0125418 A1 | 6/2006 | Bourgault |
| 2009/0046464 A1 | 2/2009 | Liu et al. |
| 2009/0059559 A1 | 3/2009 | Pabst et al. |
| 2009/0196045 A1 | 8/2009 | Shuai et al. |
| 2010/0001309 A1* | 1/2010 | Wang et al. ............ 257/99 |
| 2010/0046223 A1 | 2/2010 | Li et al. |
| 2010/0079059 A1 | 4/2010 | Roberts et al. |
| 2010/0091499 A1 | 4/2010 | Jiang et al. |
| 2010/0254128 A1 | 10/2010 | Pickard et al. |
| 2010/0265701 A1 | 10/2010 | Man |
| 2011/0013420 A1 | 1/2011 | Coleman et al. |
| 2011/0089830 A1* | 4/2011 | Pickard et al. ............ 315/32 |
| 2011/0101861 A1 | 5/2011 | Yoo |
| 2011/0141715 A1 | 6/2011 | Uchida et al. |
| 2012/0019138 A1* | 1/2012 | Maxik et al. ............ 315/35 |
| 2012/0140466 A1 | 6/2012 | Yang et al. |
| 2012/0268930 A1 | 10/2012 | Lu |

FOREIGN PATENT DOCUMENTS

| | | |
|---|---|---|
| EP | 1 736 701 | 12/2006 |
| EP | 2 211 094 | 7/2010 |
| FR | 2 937 795 | 4/2010 |
| GB | 2 453 718 A | 4/2009 |
| JP | 2004 039594 | 2/2004 |
| WO | 2010/039178 A1 | 4/2010 |
| WO | 2010/088303 A1 | 8/2010 |

OTHER PUBLICATIONS

International Search Report and Written Opinion for PCT/US2012/041822, dated Sep. 28, 2012, 12 pages.
International Search Report and Written Opinion for PCT/US2012/042395, dated Nov. 26, 2012, 7 pages.
International Search Report and Written Opinion for PCT/US2012/041825, dated Apr. 3, 2013, 10 pages.
Office Action for U.S. Appl. No. 13/167,394, dated May 14, 2013, 14 pages.
Office Action for U.S. Appl. No. 13/167,351, dated Jun. 12, 2013, 13 pages.
Notice of Allowance for Design U.S. Appl. No. 29/394,990, dated Aug. 13, 2013, 7 pages.
Office Action for U.S. Appl. No. 13/167,410, dated Aug. 20, 2013, 8 pages.
Notice of Allowance for U.S. Appl. No. 13/167,410, date mailed Feb. 3, 2014, 8 pages.
Office Action for U.S. Appl. No. 13/167,351, dated Nov. 13, 2013, 14 pages.

* cited by examiner

SECTION B-B

HYBRID SOLID STATE EMITTER PRINTED CIRCUIT BOARD FOR USE IN A SOLID STATE DIRECTIONAL LAMP

CROSS-REFERENCE TO RELATED APPLICATIONS

This application is related to U.S. patent application Ser. No. 13/167,351, filed Jun. 23, 2011, and titled "Retroreflective, Multi-Element Design for a Solid State Directional Lamp"; U.S. patent application Ser. No. 13/167,394, filed Jun. 23, 2011, and titled "Solid State Directional Lamp Including Retroreflective, Multi-Element Directional Lamp Optic"; U.S. patent application Ser. No. 13/167,410, filed Jun. 23, 2011, and titled "Solid State Retroreflective Directional Lamp"; and U.S. patent application Ser. No. 29/394,990, filed Jun. 23, 2011, and titled "Solid State Directional Lamp," the entirety of each of which are hereby incorporated by reference.

BACKGROUND

Solid state light emitters, such as light emitting diodes ("LED"), have become a desirable alternative to incandescent light bulbs and fluorescent light bulbs due to their energy efficiency and extended lifespan. When developing solid state directional lamps, a typical approach used to provide controlled beams of light consists of individual solid state light emitters with total internal reflection ("TIR") optics in front of each solid state light emitter. The downside to this approach is the appearance of the face of the lamp, where as few as one and as many as nine TIR lenses are lit, with unlit areas showing in between each optic. Because large TIR optics are expensive and difficult to manufacture, many existing lamps including solid state emitters use three or more smaller lenses. However, the contrast between the intense light on the face of the TIR lenses and the support structure of the lamp makes the appearance distracting, especially when these lamps are mounted at lower mounting heights or in downlight recessed cans. Accordingly, improved solid state lamps are desirable that provide low face brightness and a lack of appearance of the individual solid state light emitters on the face of the lamp as found with other designs.

SUMMARY

In order to address the need to provide solid state directional lamps that provide low face brightness and a lack of appearance of individual solid state light emitters on the face of a lamp, solid state directional lamps are provided that utilize solid state light emitters that direct light into a reflector comprising segmented parabolas and mirrored walls. Further, due to the position of the solid state light emitters within the solid state directional lamp design, the disclosed solid state directional lamps provide an air passageway that allows an airflow through the lamp that provides cooling during operation.

In one aspect, a solid sate directional lamp is disclosed. The lamp includes a printed circuit board assembled with a metal heat spreader. The lamp additionally includes a solid state light emitter positioned on the assembled printed circuit board and metal heat spreader. The metal heat spreader is configured to conduct heat generated by the solid state light emitter when energized.

In another aspect, an assembly for use in a lamp is disclosed. The assembly includes a printed circuit board and a metal heat spreader assembled with the printed circuit board. The assembled printed circuit board and metal heat spreader are configured to mount a solid state light emitter. Further, the metal heat spreader is configured to conduct heat generated by the solid state light emitter when energized. The metal heat spreader is typically in communication with heat dissipation means.

BRIEF DESCRIPTION OF THE DRAWINGS

The described systems may be better understood with reference to the following drawings and description. Non-limiting and non-exhaustive descriptions are described with reference to the following drawings. The components in the figures are not necessarily to scale, emphasis instead being placed upon illustrating principles. In the figures, like referenced numerals may refer to like parts throughout the different figures unless otherwise specified.

DETAILED DESCRIPTION

Figure 1:
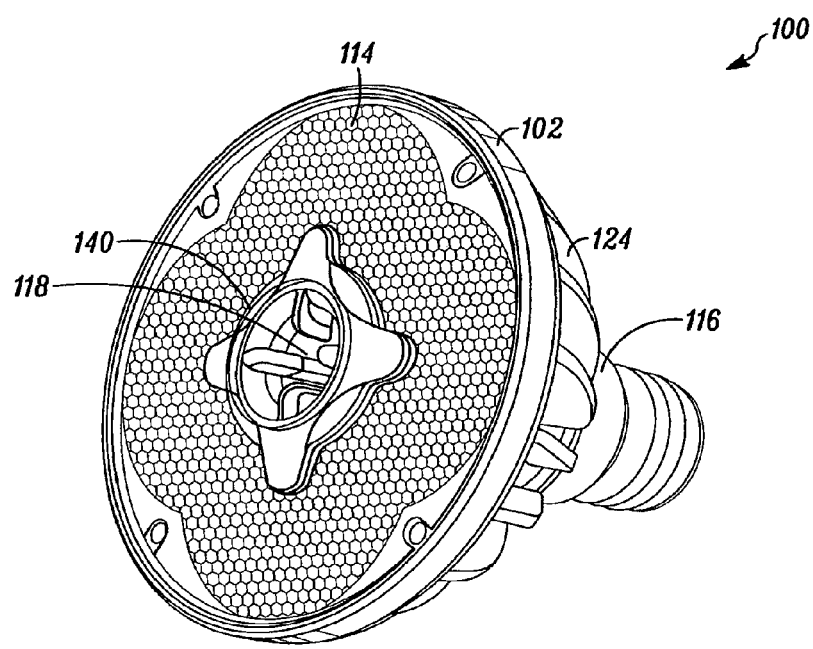
FIG. 1 is a perspective view of one implementation of a solid state directional lamp.

The present disclosure is directed to solid state directional lamp designs that include retroreflective, multi-element lamp optics and a hybrid solid state emitter printed circuit board. The disclosed solid state directional lamps provide low face brightness and a lack of appearance of individual solid state light emitters on the face of the lamp. Additionally, the described solid state directional lamps provide an air passageway that allows air to flow through the solid state directional lamp during operation.

As used herein, the term "and/or" includes any and all combinations of one or more of the associated listed items. All numerical quantities described herein are approximate and should not be deemed to be exact unless so stated.

Although the terms "first", "second", etc. may be used herein to describe various elements, components, regions, layers, sections and/or parameters, these elements, components, regions, layers, sections and/or parameters should not be limited by these terms. These terms are only used to distinguish one element component, region layer or section from another region, layer or section. Thus, a first element component, region, layer or section discussed below could be termed a second element, component, region, layer or section without departing from the teachings of the present inventive subject matter.

It will be understood that when a first element such as a layer, region or substrate is referred to as being "on" a second element, or extending "onto" a second element, or be "mounted on" a second element, the first element can be directly on or extend directly onto the second element, or can be separated from the second element structure by one or more intervening structures (each side, or opposite sides, of which is/are in contact with the first element, the second element or one of the intervening structures). In contrast, when an element is referred to as being "directly on" or extending "directly onto" another element, there are no intervening elements present. It will also be understood that when an element is referred to as being "connected" or "coupled" to another element, it can be directly connected or coupled with the other element or intervening elements can be present. In contrast, when an element is referred to as being "directly connected" or "directly coupled" to anther element, there are no intervening elements present. In addition, a statement that a first element is "on" a second element is synonymous with a statement that the second element is "on" the first element.

Relative terms such as "lower", "bottom", "below", "upper", "top", "above", "horizontal" or "vertical" may be used herein to describe one element's relationship to anther element as illustrated in the Figures. Such relative terms are intended to encompass different orientations of the device in addition to the orientation depicted in the Figures. For example, if the device in the Figures is turned over, elements described as being on the "lower" side of other elements would then be oriented on "upper" sides of other elements. The exemplary term "lower", can therefore, encompass both an orientation of "lower and "upper," depending on the particular orientation of the figure. Similarly, if the device in one of the figures is turned over, elements described as "below" or "beneath" other elements would then be orientated "above" the other elements. The exemplary terms "below" or "beneath" can, therefore, encompass both an orientation of above and below.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 2:
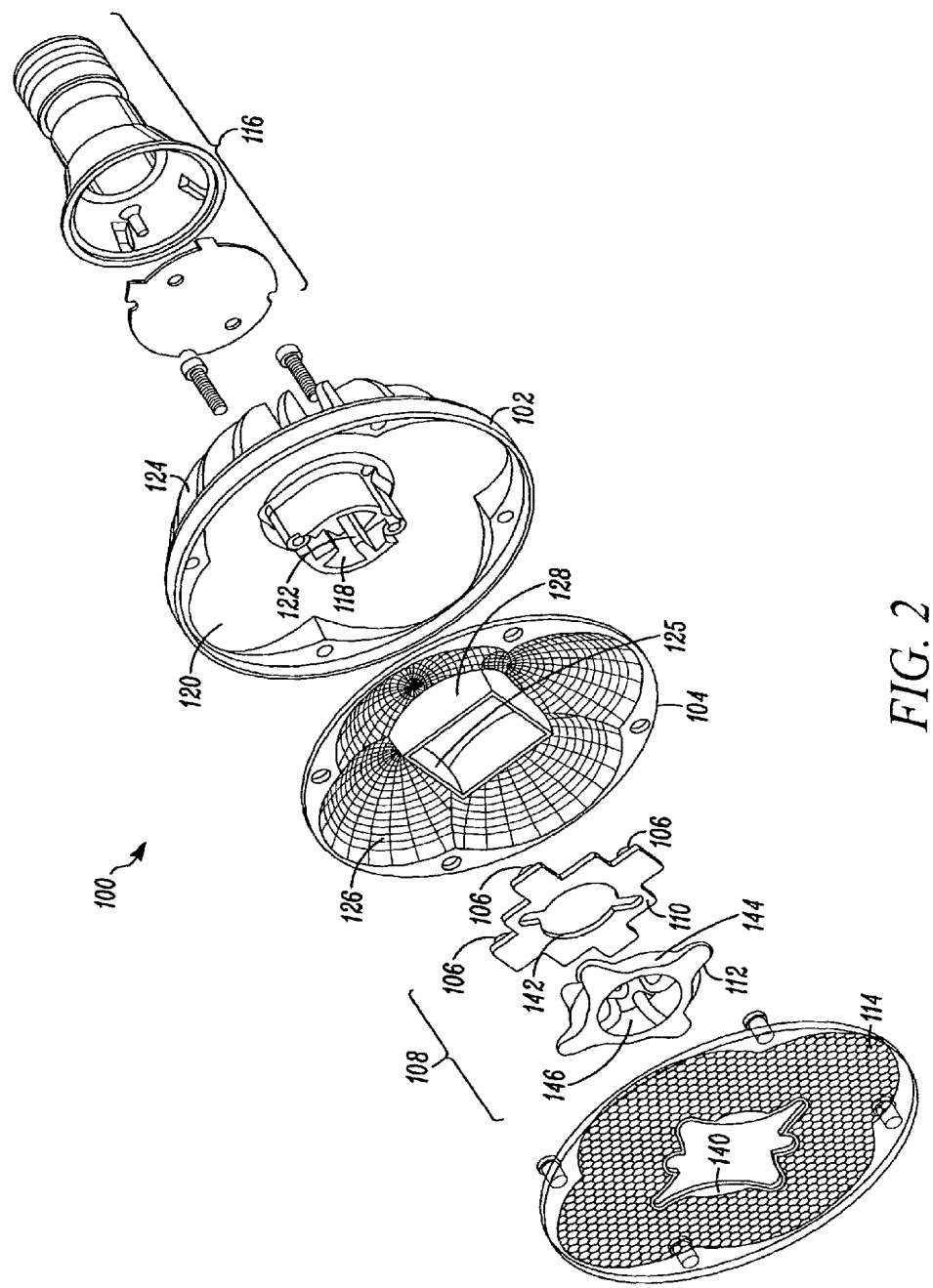
FIG. 2 is an exploded view of the solid state directional lamp of FIG. 1.

FIG. 1 is a perspective view of one implementation of a solid state directional lamp and FIG. 2 is an exploded view of the solid state directional lamp illustrated in FIG. 1. The solid state directional lamp 100 may include a housing 102, a reflector 104, a solid state light emitter 106, an assembly 108 including a printed circuit board 110 and a metal heat spreader 112, a lens 114, and a power supply housing 116. It will be appreciated that while FIG. 1 illustrates the power supply housing 116 defining an Edison screw, in other implementations, the power supply housing 116 may define other shapes for use in lamp fixtures utilizing connections other than an Edison screw.

In some implementations, the housing 102 of the solid state direction lamp 100 is dimensioned to conform to the shape of a standard PAR 20 bulb, a standard PAR 30 bulb, or a standard PAR 38 bulb, or commercial profile PAR 20, PAR 30, or PAR 38 bulbs. However, in other implementations the housing 102 of the solid state directional lamp 100 may be dimensioned to other standardized or non-standardized bulb shapes such as an MR16 lamp, R lamps such as R20, R30, or R40 lamps, ER lamps such as ER30 or ER40 lamps, or BR lamps such as BR20, BR30, or BR40 lamps.

As explained in more detail below, one or more solid state light emitters 106 are positioned in the lamp 100 such that when energized, the one or more solid state light emitters 106 direct light rays toward the reflector 104 positioned in an interior of the housing 102. The reflector 104 directs the received light rays out of the lens 114 and away from the solid state directional lamp 100. Due to the color mixing features integrated within the lens 114, the front face of the solid state directional lamp 100 appears uniform.

Additionally, as explained in more detail below, due to the placement of one or more solid state light emitters 106 within the solid state directional lamp 100, an air passageway 118 is provided that allows air to flow through the lamp 100. The air passageway 118 assists in providing cooling to the lamp when one or more solid state light emitters 106 positioned adjacent to a perimeter of the air passageway 118 are energized.

In some implementations, the solid state light emitter 106 in the solid state directional lamp 102 may be a light emitting diode. Light emitting diodes are semiconductor devices that convert electrical current into light. A wide variety of light emitting diodes are used in increasingly diverse fields for an ever-expanding range of purposes. More specifically, light emitting diodes are semiconducting devices that emit light (ultraviolet, visible, or infrared) when a potential difference is applied across a p-n junction structure. There are a number of ways to make light emitting diodes and associated structures, and the present inventive subject matter can employ any such devices.

A light emitting diode produces light by exciting electrons across the band gap between a conduction band and a valence band of a semiconductor active (light-emitting) layer. The electron transition generates light at a wavelength that depends on the band gap. Thus, the color of the light (wavelength) (and/or the type of electromagnetic radiation, e.g., infrared light, visible light, ultraviolet light, near ultraviolet light, etc., and any combinations thereof) emitted by a light emitting diode depends on the semiconductor materials of the active layers of the light emitting diode.

The expression "light emitting diode" is used herein to refer to the basic semiconductor diode structure (i.e., the chip). The commonly recognized and commercially available "LED" that is sold (for example) in electronics stores typically represent a "packaged" device made up of a number of parts. These packaged devices typically include a semiconductor based light emitted diode such as (but not limited to) those described in U.S. Pat. Nos. 4,918,487; 5,631,190; and 5,912,477; various wire connections, and a package that encapsulates the light emitting diode.

Fabrication of conventional LEDs is generally known, and is only briefly discussed herein. LEDs can be fabricated using known processes with a suitable process being fabrication using metal organic chemical vapor deposition (MOCVD). The layers of the LEDs generally comprise an active layer/region sandwiched between first and second oppositely doped epitaxial layers, all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in LEDs, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on LEDs with the fingers spaced to enhance current spreading from the pads into the LED's top surface. In operation, an electrical signal is applied to the pads through a wire bond as described below, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light and emitting a different wavelength of light such that the LED emits a combination of light from the LED and the phosphor. In some implementations, white emitting LEDs have an LED that emits light in the blue wavelength spectrum and the phosphor absorbs some of the blue light and re-emits yellow. The LEDs emit a white light combination of blue and yellow light. In other implementations, the LED chips emit a non-white light combination of blue and yellow light as described in U.S. Pat. No. 7,213,940. In some implementations the phosphor comprises commercially available YAG:Ce, although a full range of broad yellow spectral emission is possible using conversion particles made of phosphors based on the $(Gd, Y)_3(Al, Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_xCa_y$-$SiO_4$:Eu.

LEDs that emit red light can comprise LED structures and materials that permit emission of red light directly from the active region. Alternatively, in other embodiments the red emitting LEDs can comprise LEDs covered by a phosphor that absorbs the LED light and emits a red light. Some phosphors appropriate for this structures can comprise: $Lu_2O_3$: $Eu^{3+}$; $(Sr_{2-x}La_x)(Ce_{1-x}Eu_x)O_4$; $Sr_{2-x}Eu_xCeO_4$; $SrTiO_3$:$Pr^{3+}$, $Ga^{3+}$; $CaAlSiN_3$: $Eu^{2+}$; and $Sr_2Si_5N_8$:$Eu^{2+}$.

LEDs that are coated can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submounts described herein can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polymide and polyester etc. In one embodiment, the dielectric material has a high thermal conductivity such as with aluminum nitride and silicon carbide. In other embodiments the submounts can comprise highly reflective material, such as reflective ceramic or metal layers like silver, to enhance light extraction from the component. In other embodiments the submount can comprise a printed circuit board (PCB), alumina, sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

Figure 3:
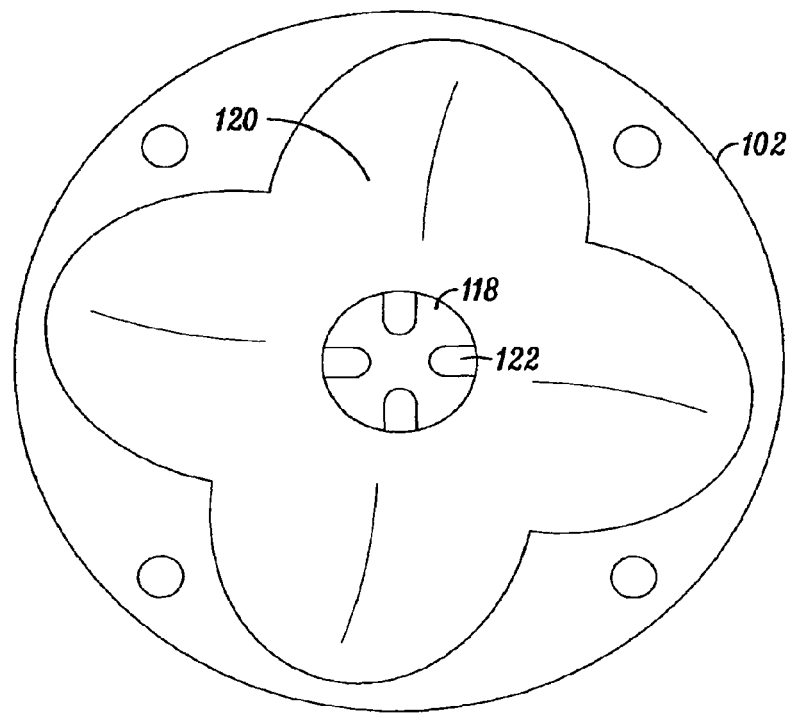
FIG. 3 is a top view of one implementation of a housing of a solid state directional lamp.
Figure 4:
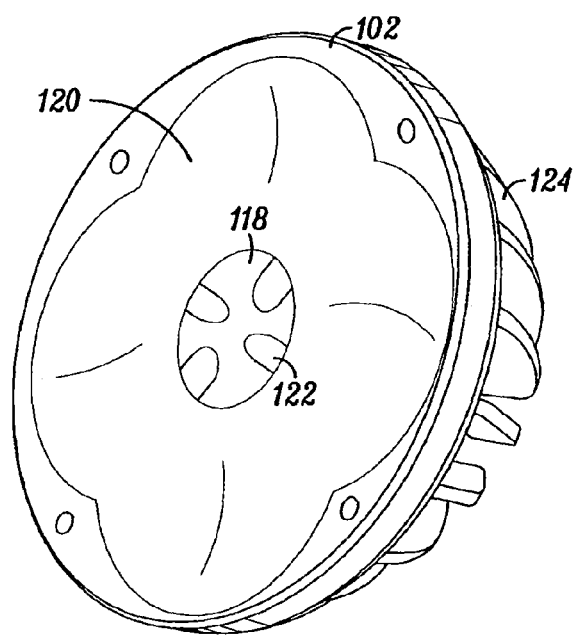
FIG. 4 is a top perspective view of the housing of FIG. 3.
Figure 5:
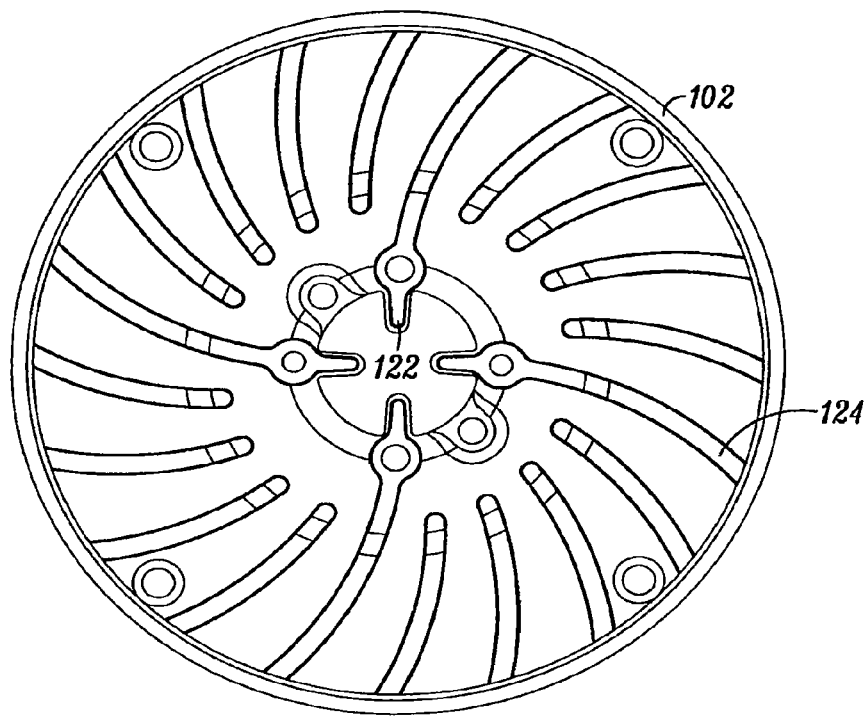
FIG. 5 is bottom view of the housing of FIG. 3.
Figure 6:
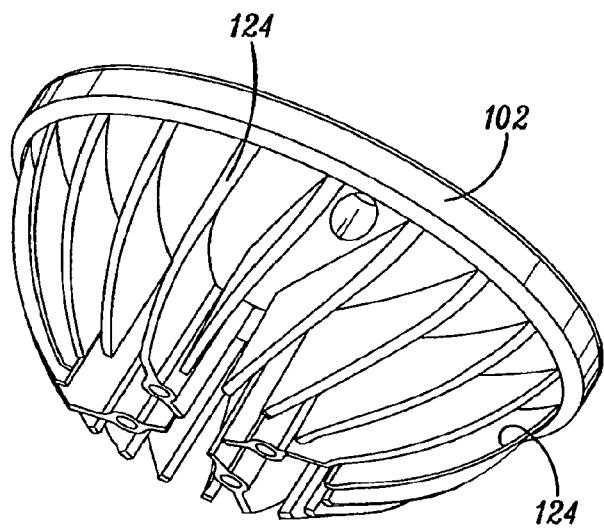
FIG. 6 is a bottom perspective view of the housing of FIG. 3.

FIGS. 3-6 illustrate different views of one implementation of the housing 102 of the solid state directional lamp 100. FIG. 3 is a top view of the housing 102; FIG. 4 is a top perspective view of the housing 102; FIG. 5 is bottom view of the housing 102; and FIG. 6 is a bottom perspective view of the housing 102.

In some implementations the housing 102 may comprise aluminum. However, in other implementations the housing 102 may comprise, for example, magnesium, a magnesium/aluminum alloy, or other thermally conductive thermoplastics. Yet other implementations may comprise a sintered metal that may include composites that are aluminum based, but infused with metals such as copper to improve thermal conductivity or provide other desirable mechanical, thermal or electrical properties.

Referring to FIGS. 3 and 4, the housing 102 may define the air passageway 118. The air passageway 118 is configured to allow air to flow from one side of the housing 102 to another side of the housing 102. In some implementations, the housing 102 may additionally define one or more fins 122 within the air passageway 118. The fins 122 may assist in directing airflow through the air passageway 118 and provide increased surface area to the housing 102 to assist in cooling the directional lamp 100 during operation. When the solid state directional lamp 100 is assembled and one or more solid state light emitters 106 are energized, air flowing through the air passageway 118 provides cooling to the lamp, as explained in more detail below.

The housing 102 additionally defines an interior region 120 on a first side the housing 102. The interior region 120 is configured such that when the solid state directional lamp 100 is assembled, the reflector 104 may be positioned within the interior region 120 of the housing 102. In some implementations, the contour of the interior region conforms to the contour of the reflector 104. For example, if the reflector 104 defines a plurality of segmented parabolas as in one illustrative example described below, the contour of the interior region is shaped to accept the plurality of segmented parabolas. As shown in FIGS. 3 and 4, the air passageway 118 passes through the interior region 120 of the housing 102 such that air may flow through the interior region of the housing 102.

Referring to FIGS. 5 and 6, in some implementations, the housing 102 may additionally define a plurality of fins 124 on a second side of the housing 102 that is opposite to the side of the housing defining the interior region 120. In some implementations a depth of the reflector 104 and the complementary interior region 120 of the housing 102 is shallow such that the plurality of fins 124 on the second side of the housing 102 make up a majority of a volume of the housing 102 and thus a majority of the volume of the lamp 100. For example, in some implementations, when the lamp 100 is assembled, the housing 102 consumes at least 75% of the volume of the lamp 100.

The plurality of fins 124 on the second side of the housing 102 may serve as a heat sink for the housing 102 by providing the housing 102 increased surface area to dissipate heat. Accordingly, it should be appreciated that the shallow nature of the reflector 104 allows the solid state direction lamp 100 to implement improved cooling features such as the plurality of fins 124 on the second side of the housing 102 that act as a heat sink for the housing 102 and define a majority of a volume of the housing 102.

The plurality of fins 124 on the second side of the housing, in conjunction with the fins 122 positioned in the air passageway 118 may additionally serve to direct airflow around the housing 102. For example, when the power supply housing 116 is positioned in the solid state direction lamp 100 adjacent to the housing 102, the fins 122 positioned in the air passageway 118 and the plurality of fins 124 on the second side of the housing 102 may direct air over the power supply housing 116 to assist in cooling the lamp 100.

Figure 7:
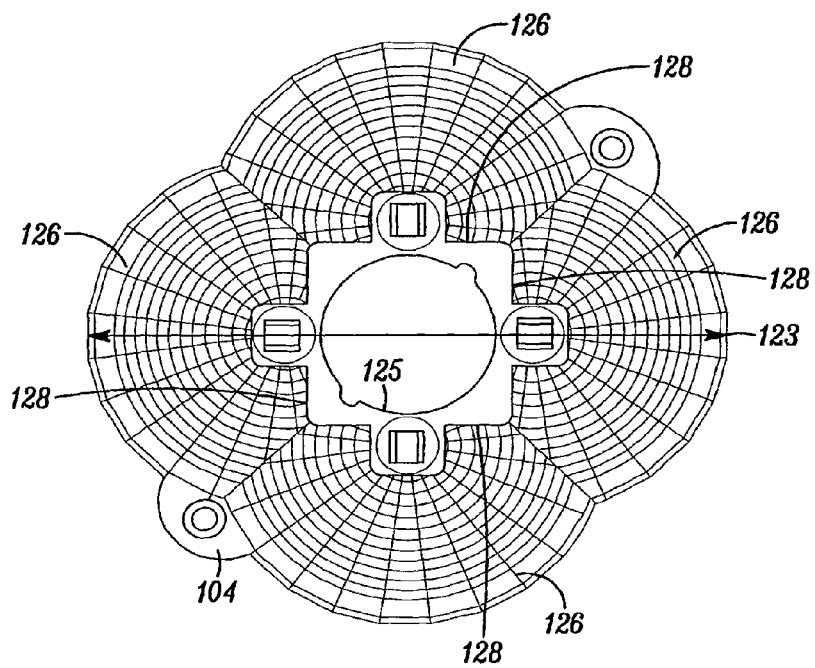
FIG. 7 is a top view of one implementation of a reflector of a solid state directional lamp.
Figure 8:
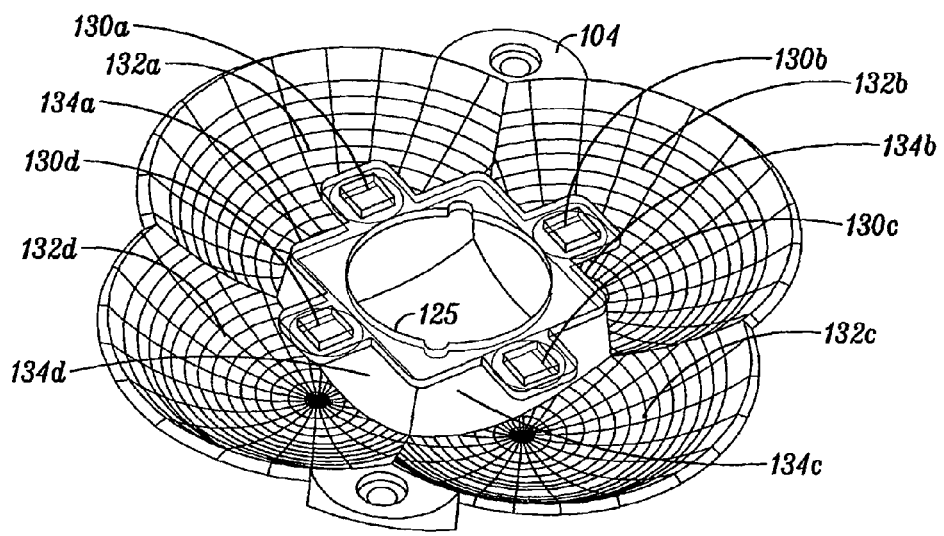
FIG. 8 is a perspective view of the reflector of FIG. 7.

FIGS. 7 and 8 illustrate different views of one implementation of the reflector 104 of the solid state directional lamp 100. FIG. 7 is a top view of the reflector 104 and FIG. 8 is a perspective view of the reflector 104. In some implementations, the reflector 104 may comprise a polycarbonate such as Lexan, a PC/ABS blend such as Cycoloy produced by Sabic, a polyarylate such as U-Polymer, and/or a polyethylene terephthalate or a PBT such as valox produced by Sabic.

Typically, a depth of the reflector 104 is shallow when compared to a furthest distance 123 of the opening of the reflector 104 so that the aspect ratio between the furthest distance 123 of the opening of the reflector 103 and the depth of the reflector is at least 6:1. In some implementations, a depth of the reflector is no greater than 16 mm.

The reflector 104 defines an aperture 125 configured to allow the air passageway 118 of the housing 102 to pass through the reflector 104 so that when the solid state directional lamp 100 is assembled, air may flow through the center of the lamp.

The reflector may additionally define a plurality of geometric curves 126 and a plurality of mirrored portions 128. In some implementations, the plurality of geometric curves 126 may be a plurality of segmented parabolas. However, in other implementations, the geometric curves 126 may be compound curves that are parabolic in some portions of the geometric curve and elliptical in other portions of the geometric curve or any other geometric shape configured to, as explained in more detail below, receive light from one or more solid state light emitters 106 and direct the received light out of the direction lamp 100.

In some implementations the plurality of mirrored portions 128 include mirrored walls. However, the mirrored portions 128 may be any shape configured to, as explained in more detail below, receive light from the cne or more solid state light emitters 106 and direct the received light into one or more of the plurality of geometric curves 126.

In some implementations, each solid state light emitter 106 of the directional lamp 100 is associated with a geometric curve 126 and a mirrored portion 128. For example, as shown in FIG. 8, a first solid state light emitter 130a is associated with a first geometric curve 132a and a first mirrored portion 134a; a second solid state light emitter 130b is associated with a second geometric cruve 132b and a second mirrored portion 134b; a third solid state light emitter 130c is associated with a third geometric curve 132c and a third mirrored portion 134c; and a fourth solid state light emitter 130d is associated with a fourth geometric curve 132d and a fourth mirrored portion 134d. However, in other implementations, more than one solid state light emitter 106 may be associated with the same geometric curve 126 and mirrored portion 128.

Figure 9:
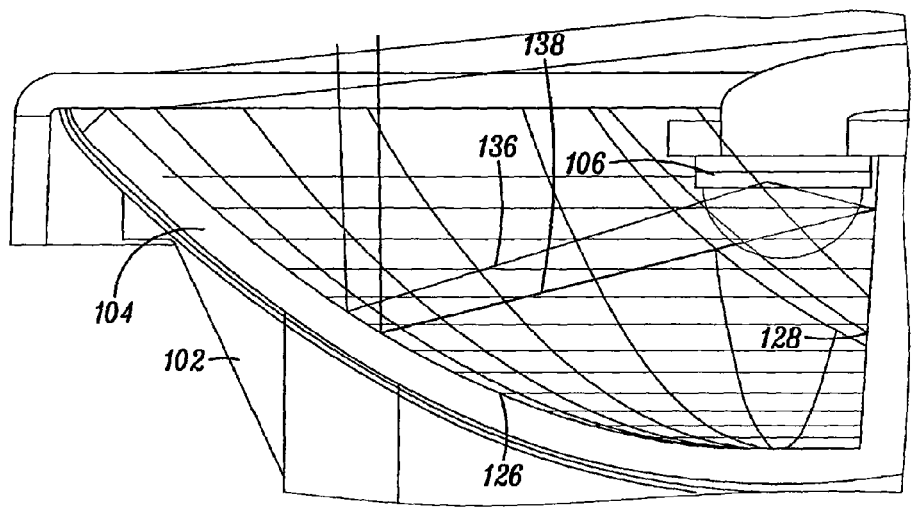
FIG. 9 is an enlarged cross sectional view of a solid state light emitter positioned at a focal point of a segmented parabola that is emitting a light ray into the segmented parabola and is emitting a light ray into a mirrored wall.

As stated above, in some implementations, each geometric curve 126 may be a segmented parabola and each mirrored portion 128 may include a mirrored wall. In these implementations, each solid state light emitter 106 may be positioned at a focal point of the segmented parabola that it is associated with. FIG. 9 is an enlarged cross sectional view of a solid state light emitter 106 positioned at a focal point of a segmented parabola (a geometric curve 126) that is emitting a light ray into the segmented parabola and is emitting a light ray into a mirrored wall (a mirrored portion 128). Due to the positioning of the solid state light emitter 106, a light ray 136 emitted from the solid state light emitter 106 that directly impinges a segmented parabola is reflected substantially vertically away from the reflector 104 and towards the lens 114 of the solid state lamp 100.

Additionally, due to the positioning of the solid state light emitter 106, a light ray 138 from the solid state light emitter 106 that directly impinges the mirrored wall is reflected into the segmented parabola and reflected substantially vertically away from the reflector 104 towards the lens 114 of the solid state lamp 100. Accordingly, the light ray 138 that directly impinges the mirrored wall behaves similarly to the light ray 136 directly impinging the segmented parabola with regard to a path to a lit target.

Typically, a surface of the mirrored wall associated with a solid light emitter 106 is may be positioned substantially perpendicular to a face of the solid state light emitter 106 such that the mirrored wall is slightly tilted from the face of the solid state light emitter 106 by between approximately 1.5 degrees and 10 degrees.

It will be appreciated that because of the mirrored portion 128 acting like a mirror, the asymmetric reflector (the geometric curve 126) behaves like a complete axisymmetric reflector. Due to this feature, multiple reflector elements (a geometric curve 126 and associated mirrored portion 128) may be combined in order to improve light output and spread power dissipation across multiple solid state light emitters 106. A solid state directional lamp 100 with two such solid state light emitters 106 would have no wasted light, but would limit the lumen output of the resultant lamp or fixture. It will be appreciated that the more geometric curves 126 and associated mirrored portions 128 that are used, the larger percentage of light from the solid state light emitters 106 that is uncontrolled. However, a reflector 104 including four geometric curves 126 and four mirrored portions 128 has been determined to provide a good balance of thermal/power spreading and controlled vs. uncontrolled light.

While the implementations described above utilize segmented parabolas and mirrored walls, it will be appreciated that other implementations may utilize other geographic shapes based the desired light output and characteristics of light distribution.

Referring to FIGS. 1 and 2, when the solid state directional lamp 100 is assembled, the lens 114 covers at least the reflector 104. Due to the nature of geometric curves 128 of the reflector 104 discussed above, the light rays from the one or more solid state light emitters 106 leaving the reflector 104 are generally collimated. In order to mix the light, the light rays leaving the reflector 104 pass through the lens 114, which is configured to mix the collimated light. Mixing the collimated light assists in providing uniform face brightness and a lack of appearance of individual solid state light emitters on the face of the lamp. In some implementations, the lens 114 is configured to increase a width of a light ray by between approximately one and two degrees.

As discussed above, the one or more solid state light emitters 106 in the directional lamp 100 may be a single color or multi-colored. When the one or more solid state light emitters 106 are multicolored, such as when the light state light emitters 106 include BSY+Red LEDs or RGBW LEDs, the lens 114 assists in mixing the different colors to create the desired color output. In some implementations the lens 114 may include microlens color-mixing features, volumetric diffusive elements, randomized surface features, and/or other diffractive elements for the purpose of mixing the light from the multicolored solid state light emitters.

In some implementations, the lens 114 may comprise polymethyl methacrylate (PMMA) or a polycarbonate. However, in other implementations the lens 114 may comprise materials such as SAN (Styrere Acrylonitrile), U-Polymer (Polyarylate), K-Resin (Styrene-Butadiene Copolymer), Tenite Cellulosics (Acetate or Butyrate), and/or transparent ABS (Acrylonitrile Butadiene Styrene).

The lens 114 may additionally define an aperture 140 positioned on the lens 104 such that when the solid state directional lamp 100 is assembled, the aperture 140 of the lens is in communication with the air passageway 118 defined by the housing 102 to allow airflow through the solid state directional lamp 100.

Figure 10:
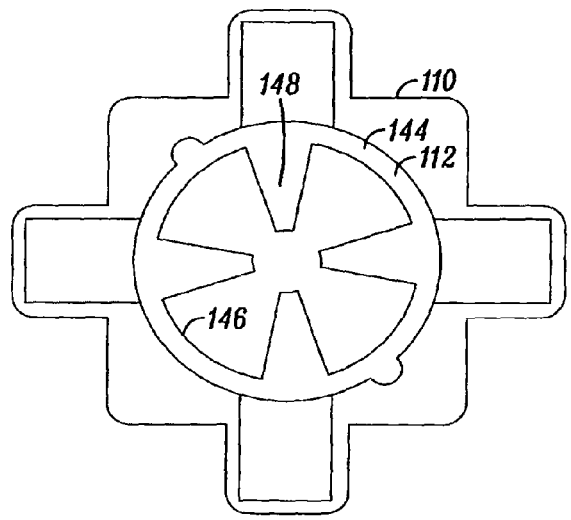
FIG. 10 is a top view of one implementation of a printed circuit board assembled with a metal heat spreader of a solid state directional lamp.
Figure 11:
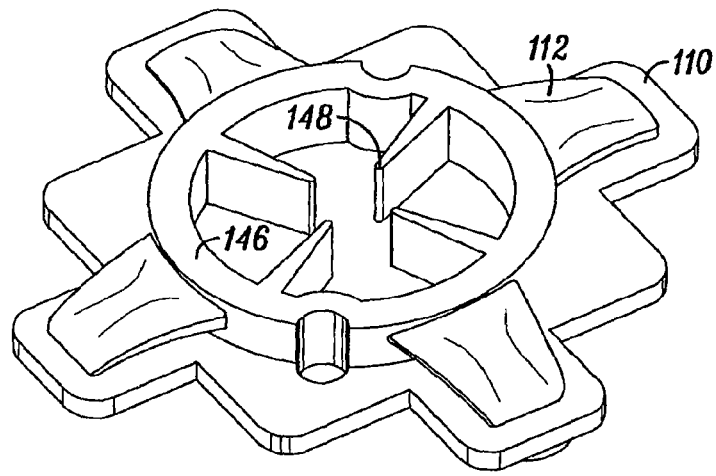
FIG. 11 is a top perspective view of the printed circuit board assembled with the metal heat spreader of FIG. 10.
Figure 12:
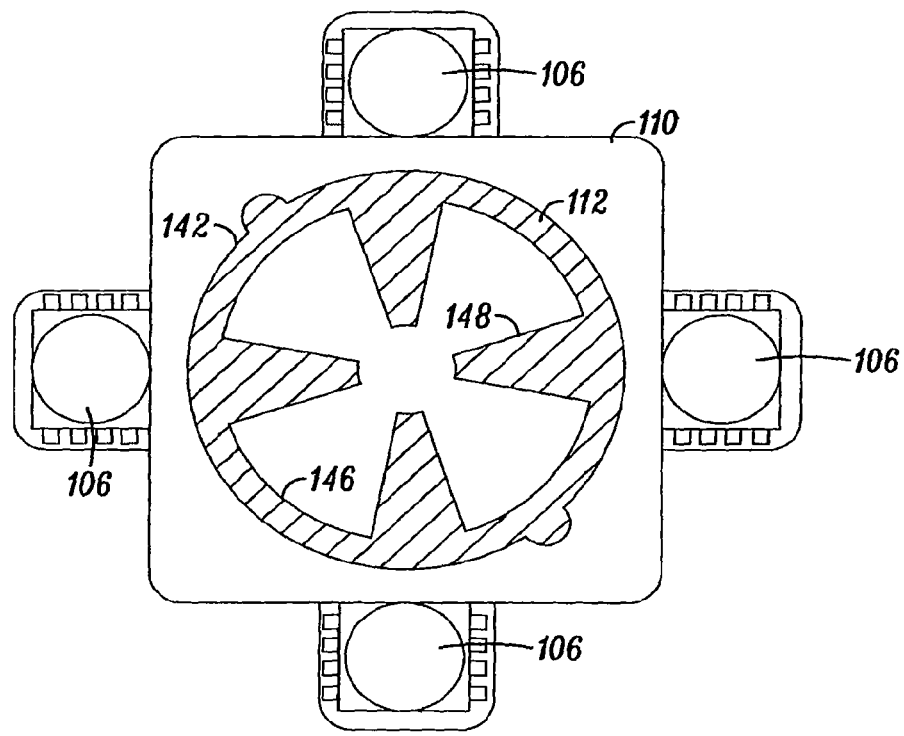
FIG. 12 is a bottom view of the printed circuit board assembled with the metal heat spreader of FIG. 10.
Figure 13:
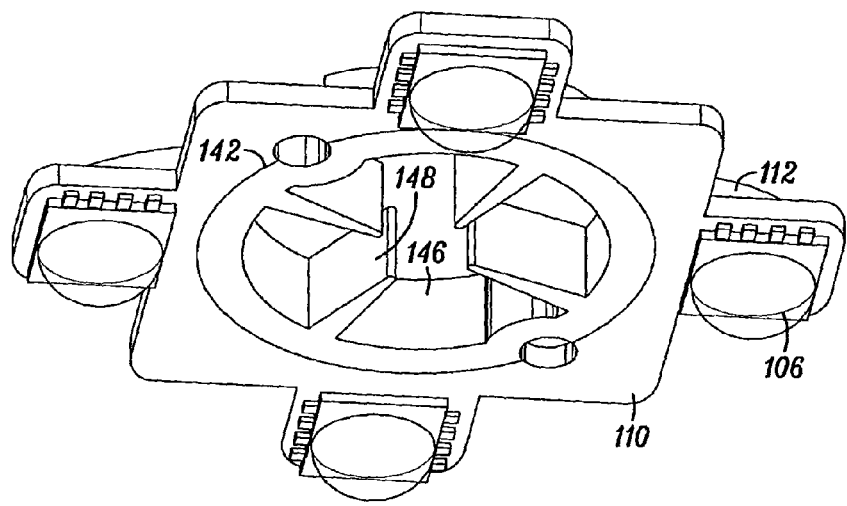
FIG. 13 is a bottom perspective view of the printed circuit board assembled with the metal heat spreader of FIG. 10.
Figure 14:
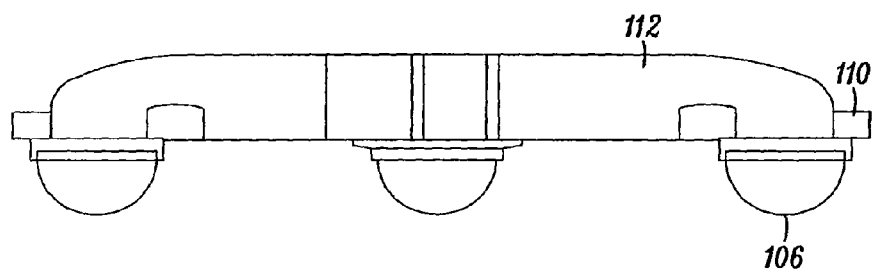
FIG. 14 is a cross sectional view of the printed circuit board assembled with the metal heat spreader of FIG. 10.

The one or more solid state light emitters 106 are mounted on the assembly 108 comprising the printed circuit board 110 and the metal heat spreader 112. FIGS. 10-14 illustrate different views of one implementation of the printed circuited board 110 assembled with the metal heat spreader 112. FIG. 10 is a top view of the printed circuit board 110 assembled with the metal heat spreader 112; FIG. 11 is a top perspective view of the printed circuit board 110 assembled with the metal heat spreader 112; FIG. 12 is a bottom view of the printed circuit board 110 assembled with the metal heat spreader 112; FIG. 13 is a bottom perspective view of the printed circuit board 110 assembled with the metal heat spreader 112; and FIG. 14 is a cross sectional view of the printed circuit board 110 assembled with the metal heat spreader 112.

In some instances, metal core printed circuit boards may be used to mount solid state light emitters for use in solid state lamps and fixtures. The aluminum or copper core allows for effective heat transfer from the solid state light emitters, through the metal core printed circuit board, and into an attached heat sink. However, in other instances a typical metal printed circuit board will not meet the needs of a fixture or lamp design, such as when the design calls for a small printed circuit board outside of a solid state light emitter package combined with a large number of traces routing to an from the solid state light emitter package. For example, in a typical 4-chip solid state light emitter routed to individual solder pads, if every trace were required to route from a bottom of a printed circuit board, the minimum width of the printed circuit board beyond the device solder pads would be three trace widths and four trace to trace spacings.

In configurations of solid state directional lamps 100 such as those described above where one or more solid state light emitters 106 direct light rays into the reflector 104 and the reflector 106 directs the received light rays out of the solid state directional lamp 100, it is desirable for the printed circuit board 110 on which the solid state light emitters 106 are mounted to have as small a footprint as possible so as not to block light that the reflector 104 directs out of the lamp. Accordingly, it will be appreciated that it is desirable that the width of the protrusions of the printed circuit board 110 on which the solid state light emitters are mounted should be as narrow as possible.

In the implementation shown in FIGS. 10-14, the printed circuit board 110 defines four sides and one solid state light emiiter 106 is positioned on each of the four sides of the printed circuit board 110. A traditional single layer metal core printed circuit board may not allow for the narrow widths of the portions on which the solids state light emitters are mounted as illustrated in FIGS. 10-14. Additionally, multi-layer metal core printed circuit boards designed with the narrow widths of the portions on which the solid state light emitters are mounted as illustrated in FIG. 10-14 may incur a thermal penalty for multiple layers of dielectric material between the solid state light emitter and the metal core that is high enough in many circumstances to disqualify a multilayer metal core printed circuit board from consideration.

In order to address these issues, the directional lamp 100 may utilize a printed circuit board 110 that is not thermally conductive. In one implementation the printed circuit board 110 is a multilayer FR4 printed circuit board. A multilayer FR4 printed circuit board provides the ability to mount the solid state light emitters 106 with as little printed circuit board protrusion as possible. However, any printed circuit board may be used with a low thermal conductivity that allows for narrow widths of the protrusions on the printed circuit board on which the one or more solid state light emitters 106 are mounted.

Because the printed circuit board is not thermally conductive 110, the metal heat spreader 112 assembled with the printed circuit board 110 may contact a back of one or more of the solid state light emitters 106 in order to assist in dissipating heat generated by the solid state light emitters 106 when energized. Typically, the metal heat spreader 112 is in communication with heat dissipation means in order to assist in dissipating the heat of the solid state light emitters 106.

As shown in FIGS. 10-14, the printed circuit board 110 may define an aperture 142 configured to receive at least a portion 144 of the metal heat spreader 112. It is the portion 144 of the metal heat spreader 112 positioned in the aperture 142 of the printed circuit board 110 that is typically in communication with heat dissipation means to assist in dissipating heat generated by the one or more solid state light emitters 106.

In the solid state directional lamp 100 described above, the metal heat spreader 112 also defines an aperture 146 such that when the solid state directional lamp 100 is assembled, the aperture 146 of the metal heat spreader 112 is in communication with the air passageway 118 of the housing 102 and the aperture 140 of the lens 114. Accordingly, it will be appreciated that the air flow through the air passageway 118 of the housing 102, the aperture of 146 of the metal heat spreader 112, and the aperture 140 of the lens 114 assists in dissipating the heat that the metal heat spreader 112 conducts from the one or more solid state light emitters 106. In some implementations, the metal heat spreader 112 may define one or more fins 148 in the aperture of the metal heat spreader 112. The fins 148 in the aperture of the metal heat spreader 112 may assist in directing airflow through the air passageway 118 of the housing 102, the aperture of 146 of the metal heat spreader 112, and the aperture 140 of the lens 114. Additionally, the fins 148 in the aperture of the metal heat spreader 112 may act as a heat sink.

In other implementations, the portion 144 of the metal heat spreader 112 positioned in the aperture 142 of the printed circuit board 110 may be in communication with heat dissipation means such as a heat pipe, or the portion 144 of the metal heat spreader 112 positioned in the aperture 142 of the printed circuit board 110 may be a solid core of metal.

Figure 15:
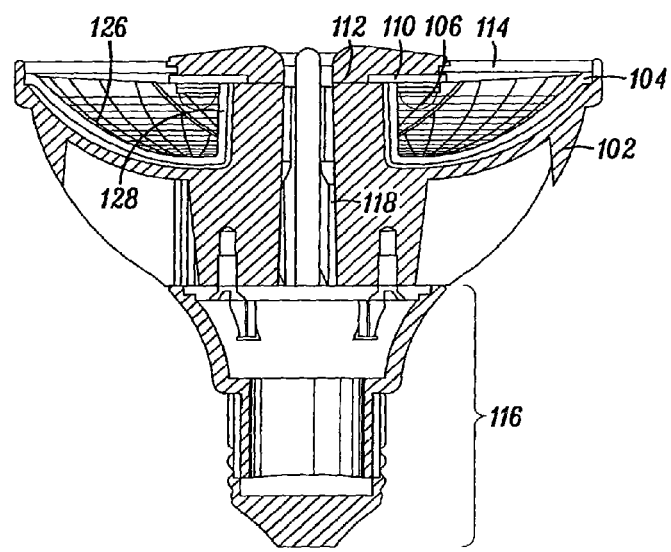
FIG. 15 is a cross sectional view of the solid state directional lamp of FIG. 1.

FIG. 15 is a cross section view of one implementation of an assembled solid state directional lamp 100. As described above, one or more solid state light emitters 106 are mounted on the printed circuit board 110 assembled with the metal heat spreader 112 and positioned in the lamp adjacent to a perimeter of the air passageway 118 of the housing 102. When energized, the solid state light emitters 106 direct light rays towards the reflector 104, which in turn directs the light rays out of the solid state directional lamp 100 through the lens 114. The lens serves to mix light from the reflector that may be collimated and assists in providing uniform face brightness and a lack of appearance of individual solid state light emitters on the face of the lamp When the solid state light emitters 106 are energized, air flows through the air passageway 118 of the housing 102 via that aperture 140 in the lens 114 and the aperture 146 of the metal heat spreader 112. As air flows through the air passageway 118 of the housing, airflow is directed over the power supply housing 116 positioned adjacent to the housing 102. Additionally, the airflow assists in dissipating the heat that the metal heat spreader 112 conducts from the one or more solid state light emitters 106 mounted on the printed circuit board 110.

It will be appreciated that the overall design of the directional lamp 100 provides efficient means for dissipating heat generated by the one or more solid state light emitters 106 and the power supply. For example, the airflow through the air passageway 118 provides improved heat transfer through the direction lamp 100 as heat generated by the solid state light emitters is dissipated through the metal heat spreader 112 and the housing 102 acting as a heat sink.

Figure 16:
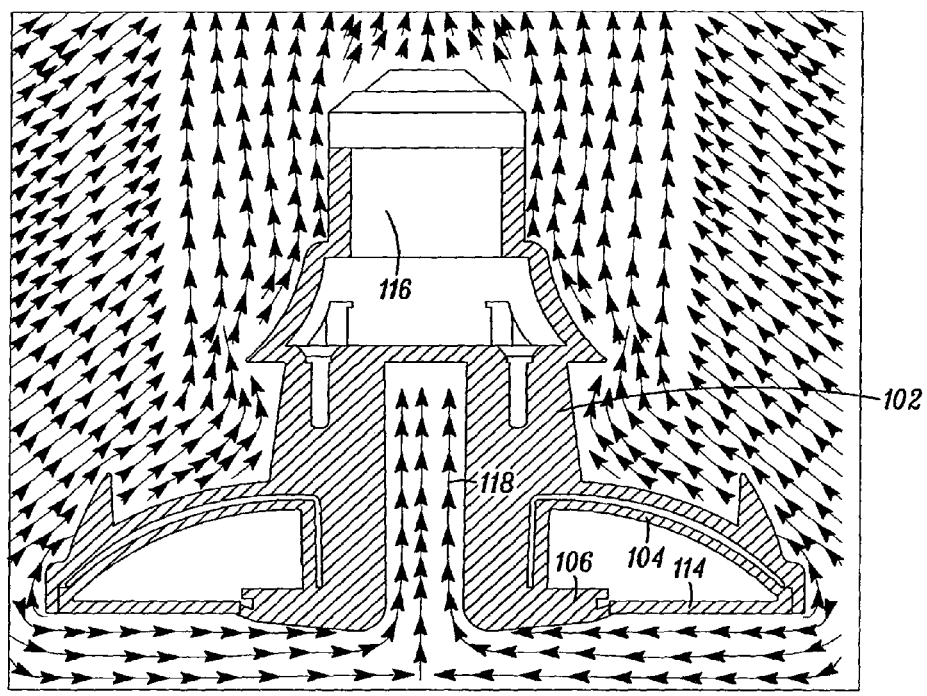
FIG. 16 is a heat flow diagram illustrating airflow and temperature when the solid state direction lamp of FIG. 1 operates in its primary orientation facing down.

FIG. 16 is a heat flow diagram illustrating airflow and temperature when the solid state directional lamp 100 operates in its primary orientation facing down where the lamp shines toward the floor from a high mounting location. As the solid state directional lamp 100 shines down, a large amount of airflow is directed around the power supply housing 116. Given that temperatures in a compact power supply housing typically exceed a temperature of a heat sink, the airflow generated provides for lower power supply 116 temperatures. Further, because the air moving through the air passageway 118 is not preheated, the temperature of the solid state light emitters 106 remain approximately 5 degrees cooler than when the solid state directional lamp 100 operates in an opposite orientation facing upwards.

Figure 17:
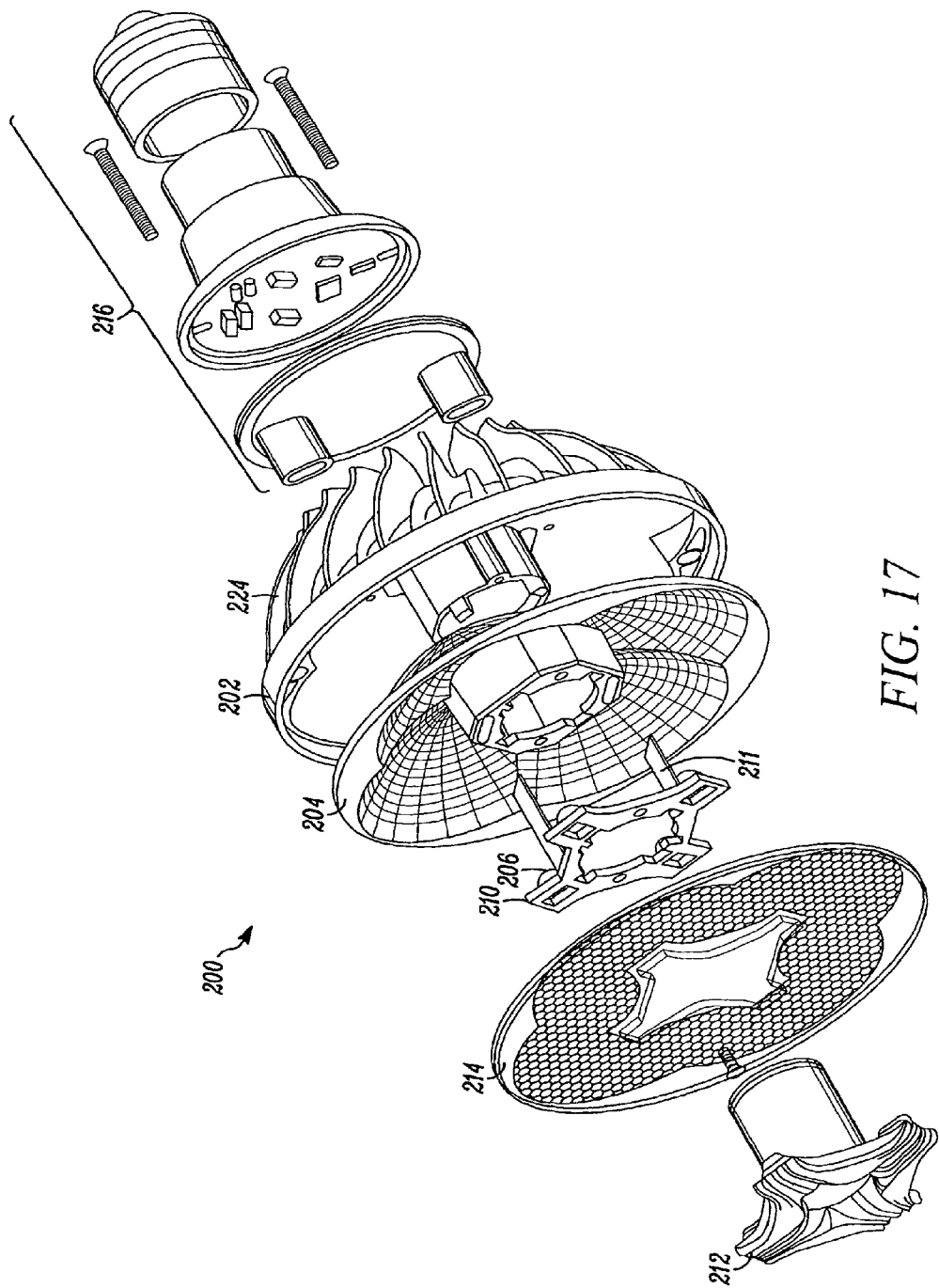
FIG. 17 is an exploded view of another implementation of a solid state directional lamp.
Figure 18:
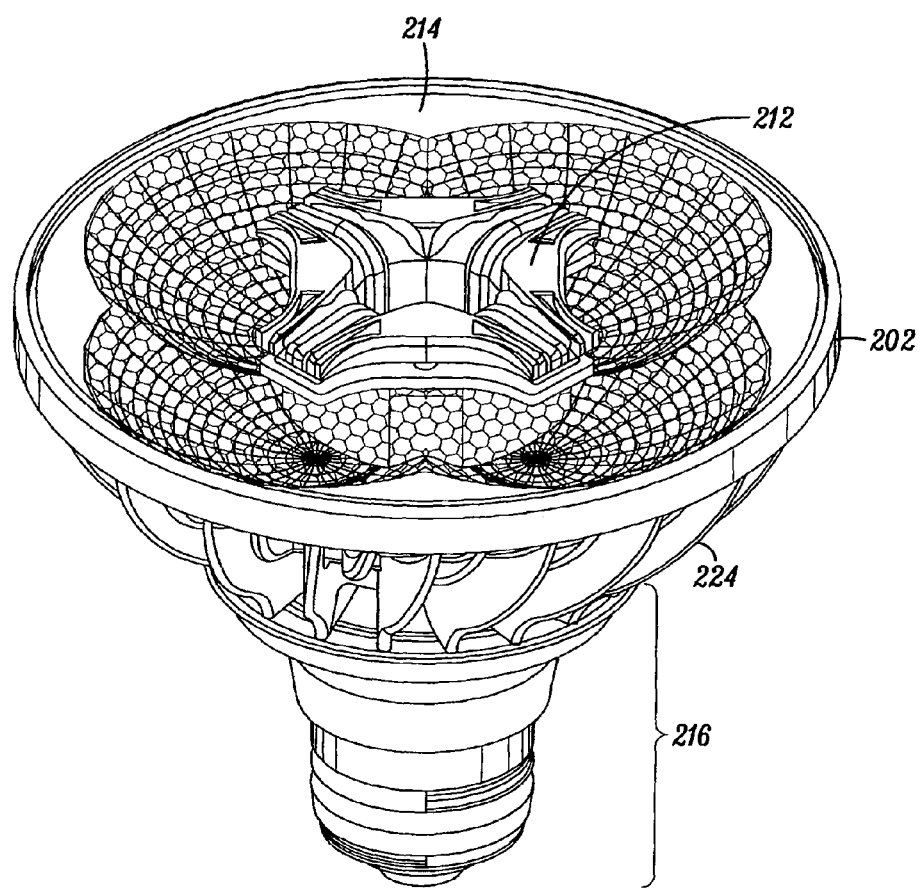
FIG. 18 is a perspective view of the solid state directional lamp of FIG. 17.
Figure 19:
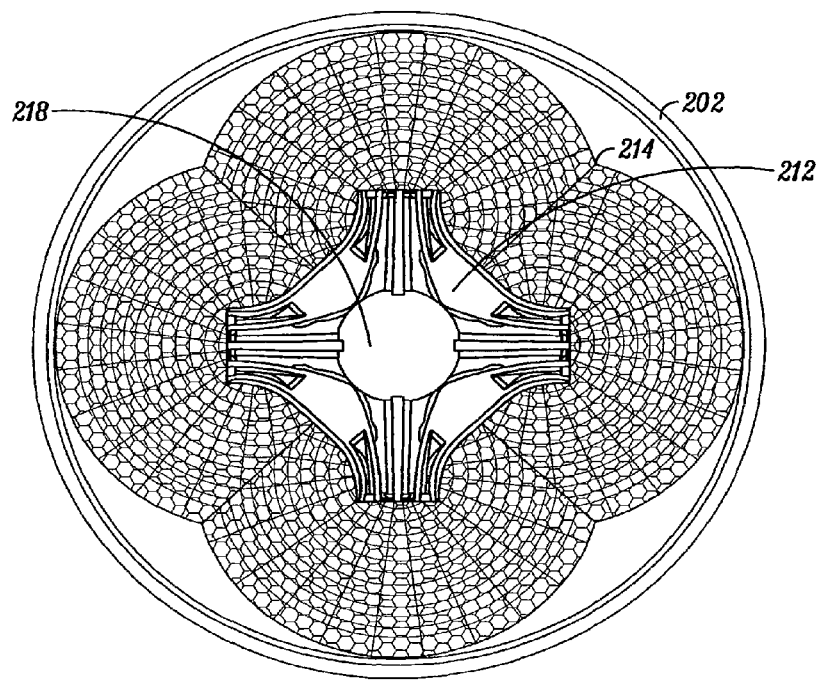
FIG. 19 is a top view of the solid state directional lamp of FIG. 17.

Another implementation of a solid state directional lamp 200 is illustrated in FIGS. 17-29. FIG. 17 is an exploded view of a solid state directional lamp 200; FIG. 18 is a perspective view of the solid state directional lamp 200 of FIG. 17; and FIG. 19 is a top view of the solid state directional lamp 200 of FIG. 17. Similar to the solid state directional lamp 100 described above, the solid state directional lamp 200 may include a housing 202, a reflector 204, a solid state light emitter 206, an assembly 208 including a printed circuit board 210 and a metal heat spreader 212, a lens 214, and a power supply housing 216.

It should be appreciated that those portions of the solid state directional lamp 200 that correspond to the portions of the solid state directional lamp 100 described above with respect to FIGS. 1-16 operate in the solid state directional lamp 200 in the same manner. Accordingly, their operation will not be described in detail below.

As with the solid state directional lamp 100 described above, the one or more solid state light emitters 206 are positioned in the lamp 200 such that when energized, the one or more solid state light emitters 206 direct light rays toward the reflector 204 positioned in an interior of the housing 202. The reflector 204 directs the received light rays out of the lens 214 and away from the solid state directional lamp 200. Due to the color mixing features integrated within the lens 214, the front face of the solid state directional lamp 200 appears uniform.

Additionally, due to the placement of the one or more solid state light emitters 206 within the solid state directional lamp 200, an air passageway 218 is provided that allows air to flow through the lamp 200. The air passageway 218 assists in providing cooling to the lamp when one or more solid state light emitters 206 positioned adjacent to a perimeter of the air passageway 218 are energized.

Figure 20:
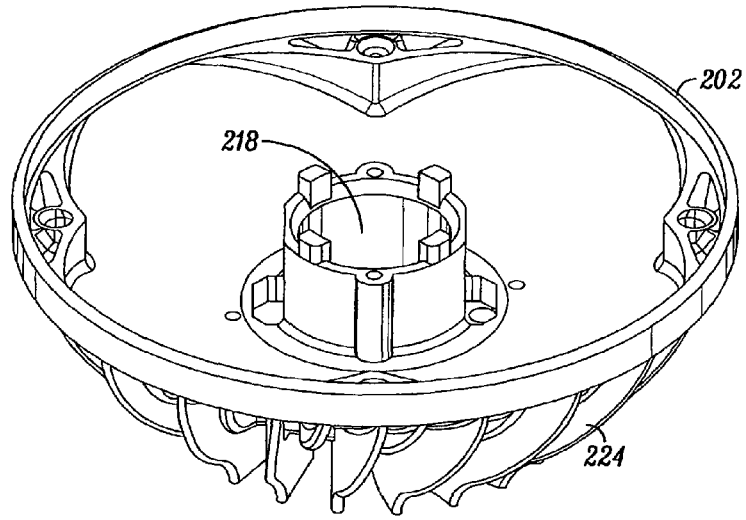
FIG. 20 is a perspective view of another implementation of a housing of a solid state directional lamp.
Figure 21:
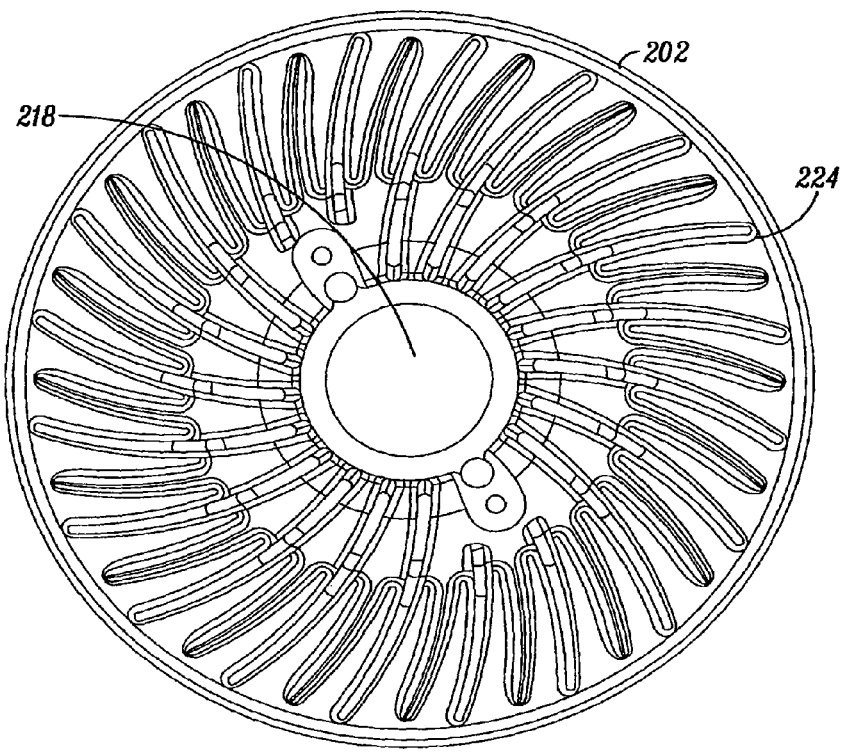
FIG. 21 is a bottom view of the housing of FIG. 20.

FIGS. 20 and 21 illustrate different views of one implementation of the housing 202. As described above, the housing 202 defines an interior region configured to receive the reflector 204. Additionally, the housing 202 defines the air passageway 218 that assists in providing cooling to the lamp. The housing 202 further defines a plurality of fins 224 that may serve as a heat sink and/or be configured to direct airflow around the housing 202.

Figure 22:
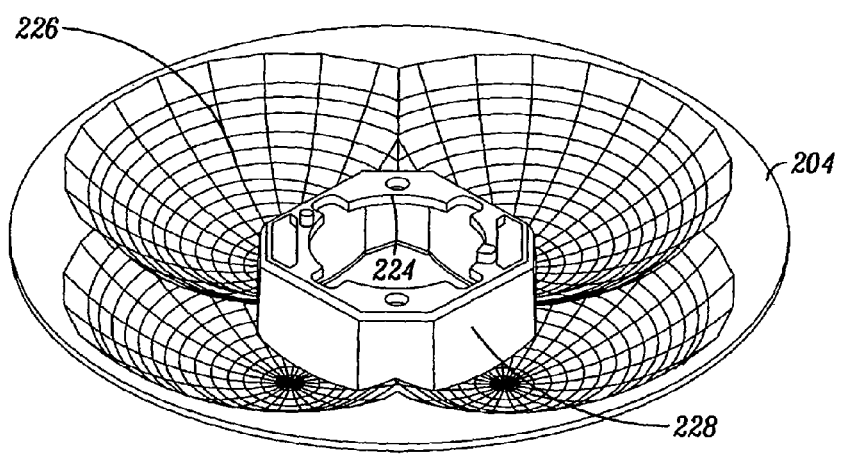
FIG. 22 is a perspective view of another implementation of a reflector of a solid state directional lamp.
Figure 23:
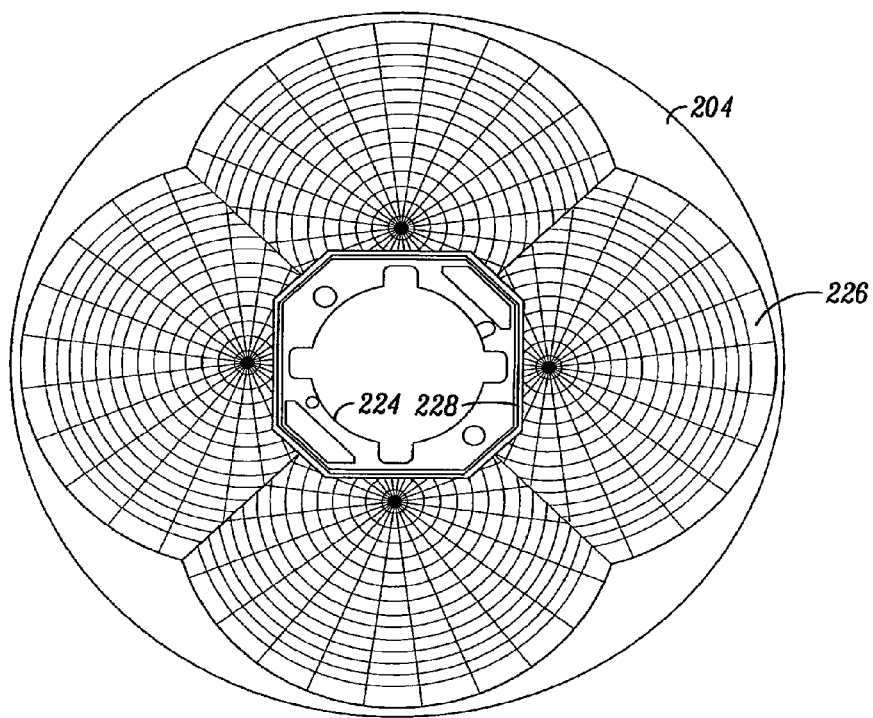
FIG. 23 is a top view of the reflector of FIG. 22.
Figure 24:
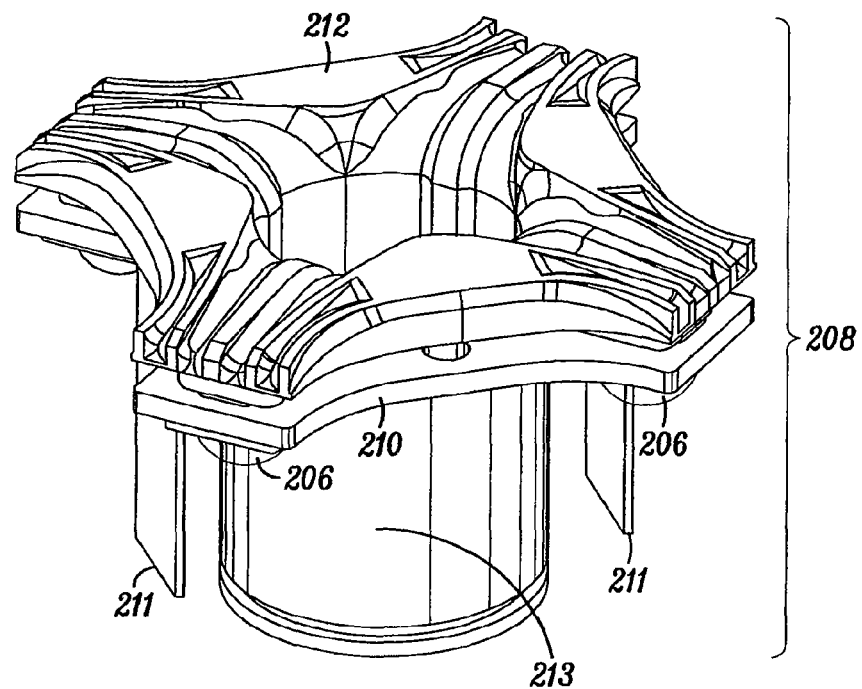
FIG. 24 is a perspective view of another implementation of a printed circuit board assembled with a metal heat spreader of a solid state directional lamp.
Figure 25:
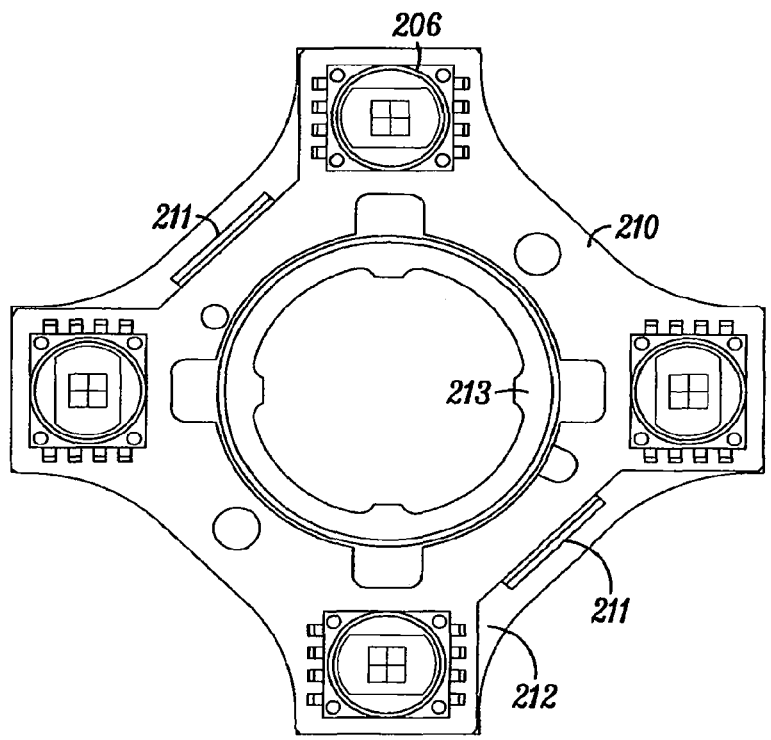
FIG. 25 is a bottom view of the printed circuit board assembled with the metal heat spreader of FIG. 24.
Figure 26:
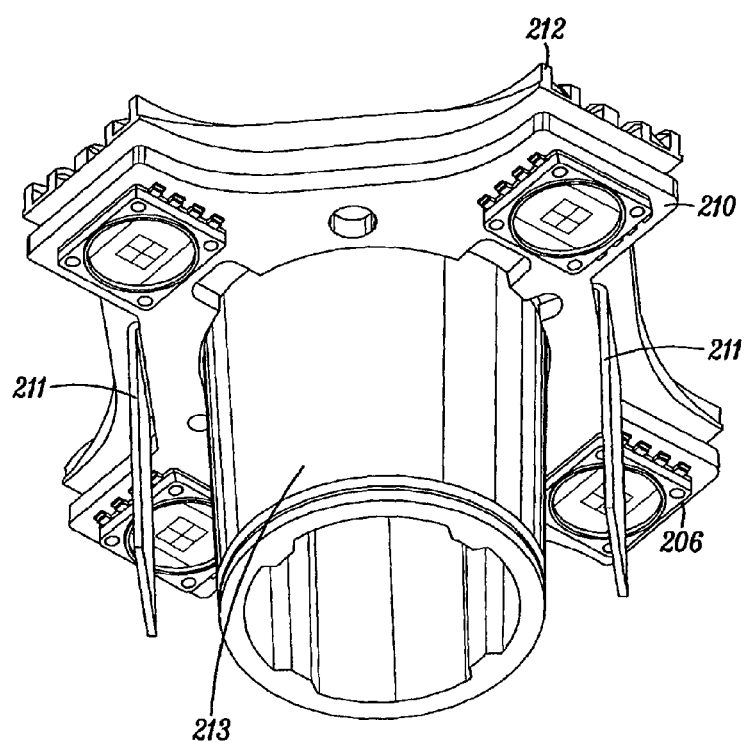
FIG. 26 is a bottom perspective view of the printed circuit board assembled with the metal heat spreader of FIG. 24.
Figure 27:
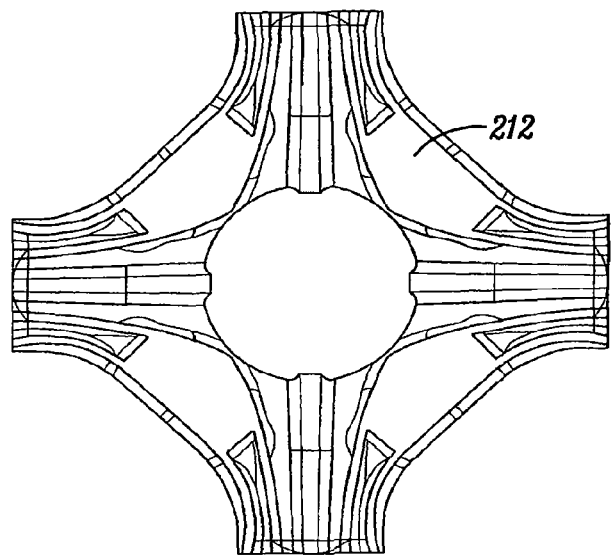
FIG. 27 is a top view of the printed circuit board assembled with the metal heat spreader of FIG. 24.
Figure 28:
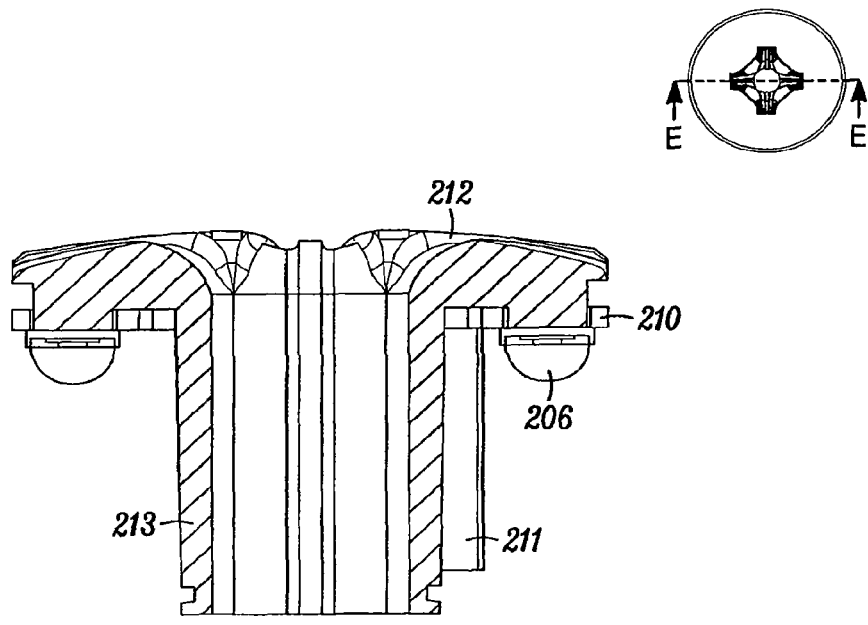
FIG. 28 is a cross sectional view of the printed circuit board assembled with the metal heat spreader of FIG. 24.

FIGS. 22 and 23 illustrate different view of one implementation of the reflector 204. As described above, the reflector 204 defines an aperture 224 configured to allow the air passageway 218 of the housing 202 to pass through the reflector 204 so that when the solid state directional lamp 200 is assembled, air may flow through the center of the lamp.

The reflector 204 may additionally define a plurality of geometric curves 226 and a plurality of mirrored portions 228. In some implementations, the plurality of geometric curves 226 may be a plurality of segmented parabolas and the plurality of mirrored portions 228 may be a plurality of mirrored walls. In these implementations, due to the positioning of the solid state light emitter 206 in the lamp 200 with respect to the reflector 204, a light ray emitted from a solid state light emitter 206 that directly impinges a geometric curve 226 is reflected substantially vertically away from the reflector 204 and towards the lens 214 of the lamp 200. Additionally, a light ray that directly impinges a mirrored portion 228 is reflected into the geometric curve 228 and reflected substantially vertically away from the reflector 204 towards the lens 214 of the lamp 200.

FIGS. 24-28 illustrate different views of one implementation of the assembly 208 including the printed circuit board 210 and the metal heat spreader 212. As described above, one or more solid state light emitters 206 may be mounted on the printed circuit board 210 and positioned in the lamp 200 to direct light rays into the reflector 204.

In order to reduce the footprint of the printed circuit board 210 so as not to block light that the reflector 204 directs out of the lamp 200, the printed circuit board may define one or more extensions 211. In some implementations, the extensions 211 are positioned substantially perpendicular to the main surface of the printed circuit board 210 (also known as the main printed circuit board). The extensions 211 provide additional surface area to mount electrical components used to drive and/or operate the solid state light emitters 206 that would otherwise be positioned on the main surface of the printed circuit board 210. In some implementations, the extensions 211 may utilize a printed circuit board that is not thermally conductive. However, in other implementations, the extensions 211 may utilize a printed circuit board that is thermally conductive while the main surface of the printed circuit board 210 utilizes a printed circuit board that is not thermally conductive.

As discussed above, in the assembly 208, the metal heat spreader 212 may contact a back of one or more of the solid state light emitters 206 in order to assist in dissipating heat generated by the solid state light emitters 206 when energized. In the implementations illustrated in FIGS. 24-28, the metal heat spreader 212 defines a collar 213 that extends away from the metal heat spreader 212. The collar 213 assists in dissipating heat by providing the metal heat spreader 212 with an increased surface area.

Figure 29:
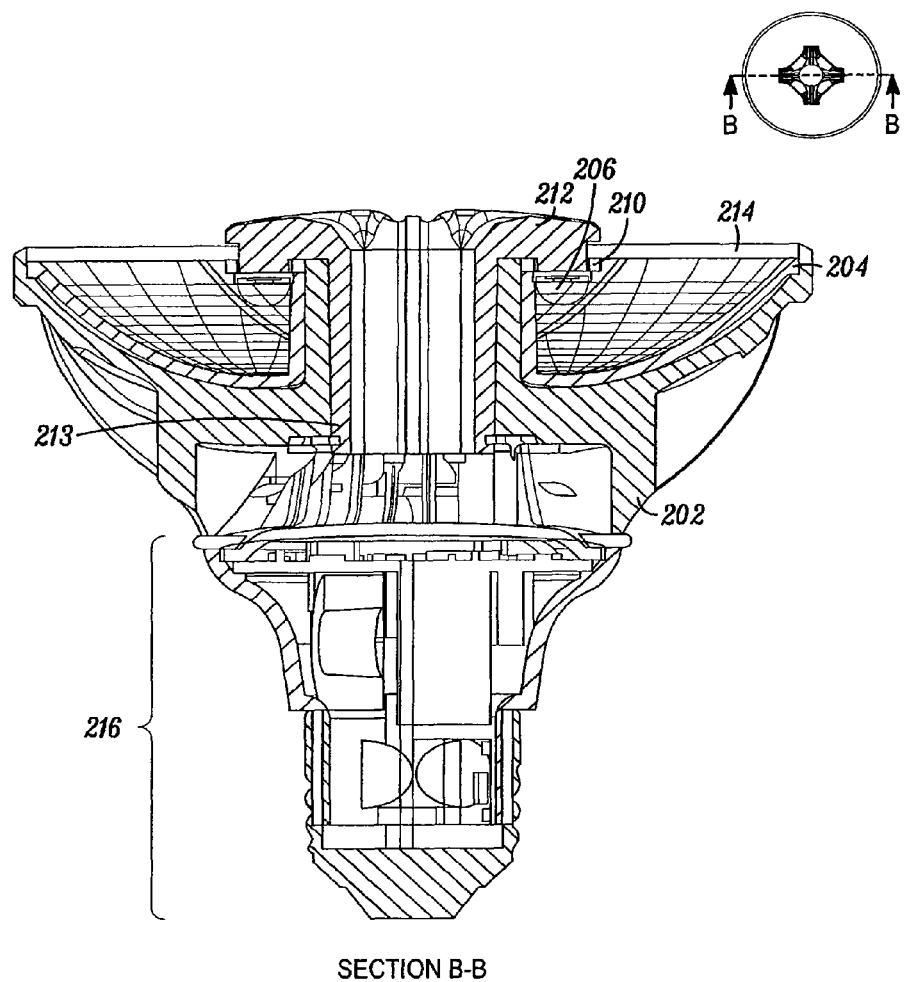
FIG. 29 is a cross sectional view of the solid state directional lamp of FIG. 17.

Further, as shown in FIG. 29, when the solid state directional lamp 200 is assembled, the collar 213 of the metal heat spreader 212 is in communication with the air passageway 218 of the housing 202. Accordingly, it will be appreciated that the airflow passing through the air passageway 218 of the housing operates in conjunction with the collar 213 of the metal heat spreader 212 to provide improved cooling to the lamp 200 when the one or more solid state light emitters 206 are energized.

Figure 30:
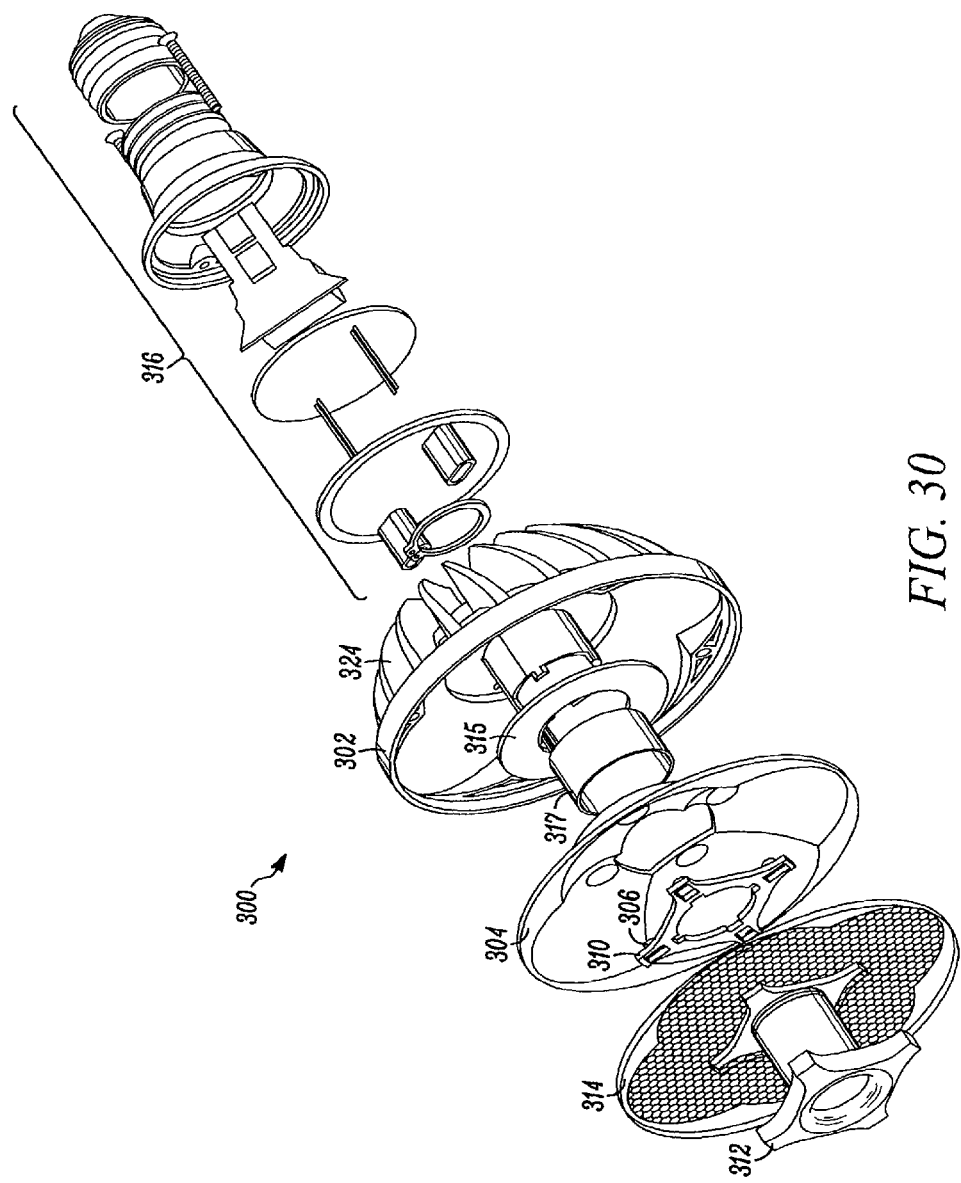
FIG. 30 is an exploded view of another implementation of a solid state directional lamp.
Figure 31:
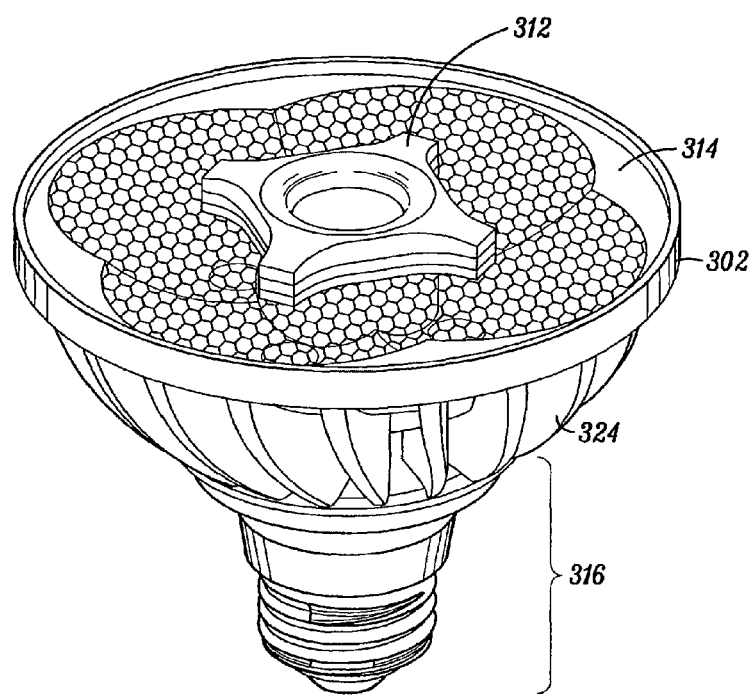
FIG. 31 is a perspective view of the solid state directional lamp of FIG. 30.
Figure 32:
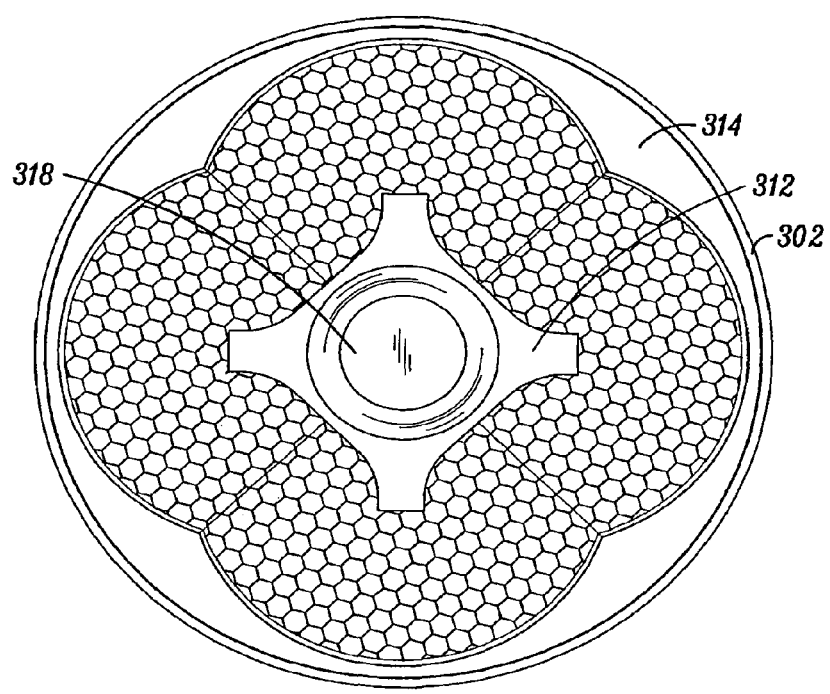
FIG. 32 is a top view of the solid state directional lamp of FIG. 30.

A further implementation of a solid state directional lamp 300 is illustrated in FIGS. 30-44. FIG. 30 is an exploded view of a solid state directional lamp 300; FIG. 31 is a perspective view of the solid state directional lamp 300 of FIG. 30; and FIG. 32 is a top view of the solid state directional lamp 300 of FIG. 30. Similar to the solid state lamps 100, 200 described above, the solid state directional lamp 300 may include a housing 302, a reflector 304, a solid state light emitter 306, an assembly 308 including a printed circuit board 310 and a metal heat spreader 312, a lens 314, and a power supply housing 316. As described in more detail below, the solid state directional lamp 300 may additionally include a second printed circuit board 315 and a reflective center collar 317.

It should be appreciated that those portions of the solid state directional lamp 300 that correspond to the portions of the solid state directional lamp 100 described above with respect to FIGS. 1-16 and/or that correspond to the portions of the solid state directional lamp 200 described above with respect to FIGS. 17-29 operate in the solid state directional lamp 300 in the same manner. Accordingly, their operation will not be described in detail below.

As discussed above, the one or more solid state light emitters 306 are positioned in the lamp 300 such that when energized, the one or more solid state light emitters 306 direct light rays toward the reflector 304 positioned in an interior of the housing 302. The reflector 304 directs the received light rays out of the lens 314 and away from the solid state directional lamp 300. Due to the color mixing features integrated within the lens 314, the front face of the solid state directional lamp 300 appears uniform.

Additionally, due to the placement of the one or more solid state light emitters 306 within the solid state directional lamp 300, an air passageway 318 is provided that allows air to flow through the lamp 300. The air passageway 318 assists in providing cooling to the lamp when one or more solid state light emitters 306 positioned adjacent to a perimeter of the air passageway 318 are energized.

Figure 33:
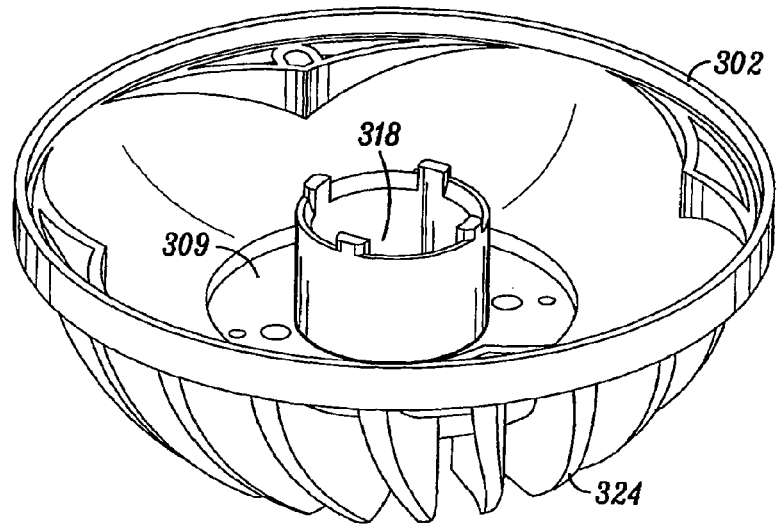
FIG. 33 is a perspective view of another implementation of a housing of a solid state directional lamp.
Figure 34:
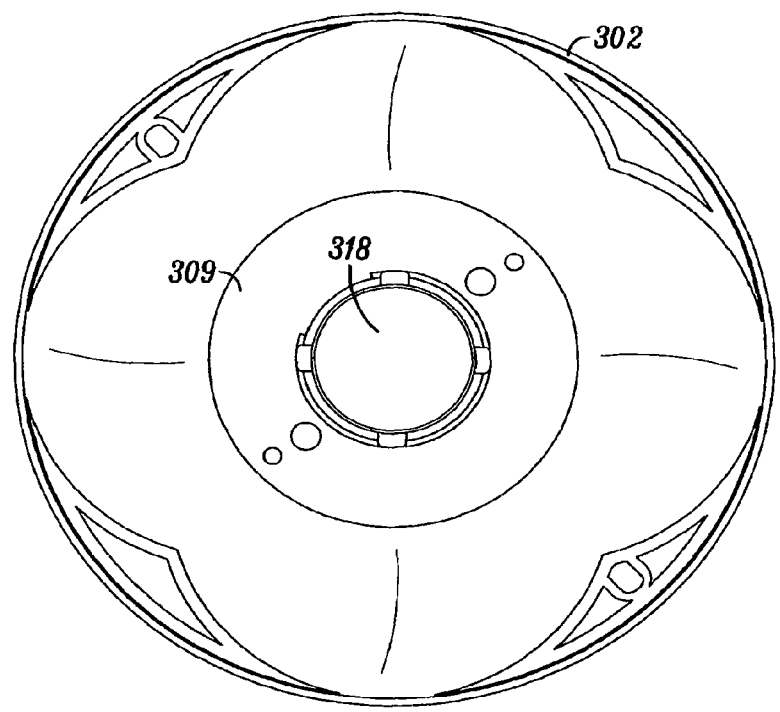
FIG. 34 is a top view of the housing of FIG. 33.

FIGS. 33 and 34 illustrate different views of one implementation of the housing 302. As described above, the housing 302 defines an interior region configured to receive the reflector 304. The housing 302 additionally defines a recess 309 within the interior region that is configured to receive the second printed circuit board 315 such that when the solid state directional lamp 300 is assembled, the second printed circuit board 315 is positioned in the housing 302 beneath the reflector 304.

The housing 302 additionally defines the air passageway 318 that assists in providing cooling to the lamp 300. The housing 302 further defines a plurality of fins 324 that may serve as a heat sink and/or be configured to direct airflow around the housing 302.

Figure 35:
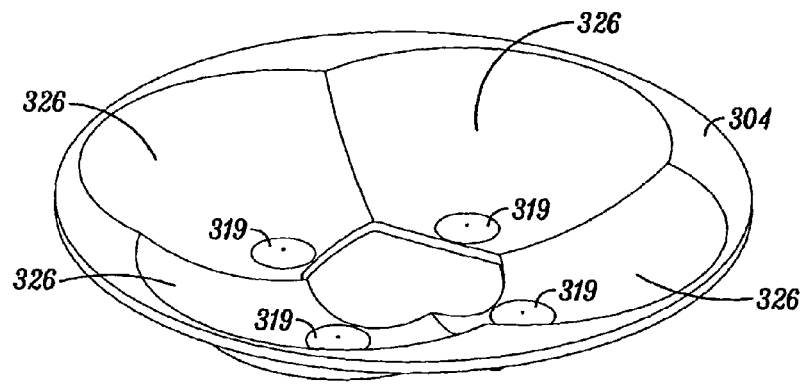
FIG. 35 is a perspective view of another implementation of a reflector of a solid state directional lamp.
Figure 36:
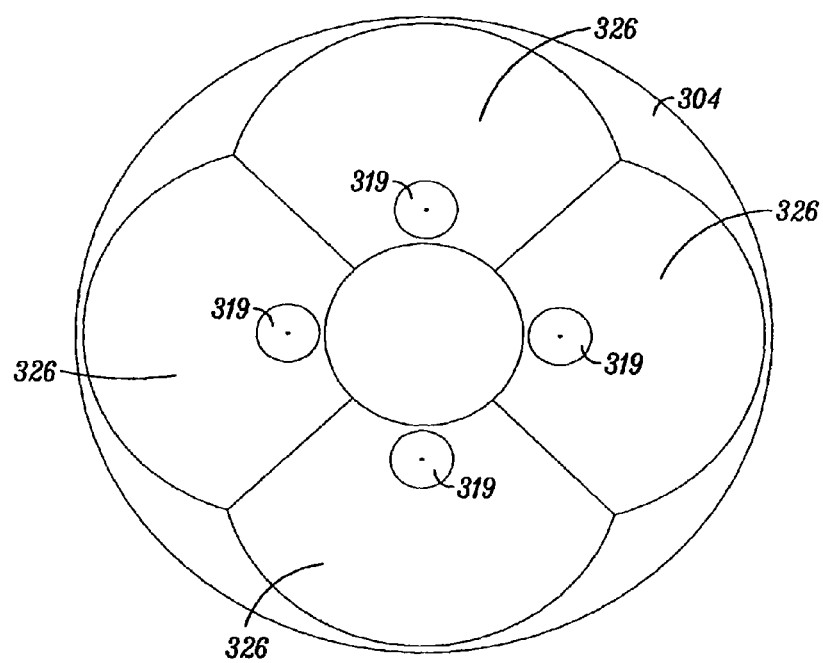
FIG. 36 is a top view of the reflector of FIG. 35.
Figure 38:
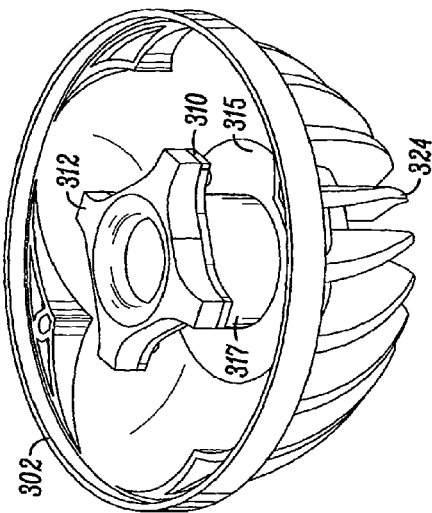
FIG. 38 is a perspective view of the portion of the solid state directional lamp of FIG. 37.
Figure 37:
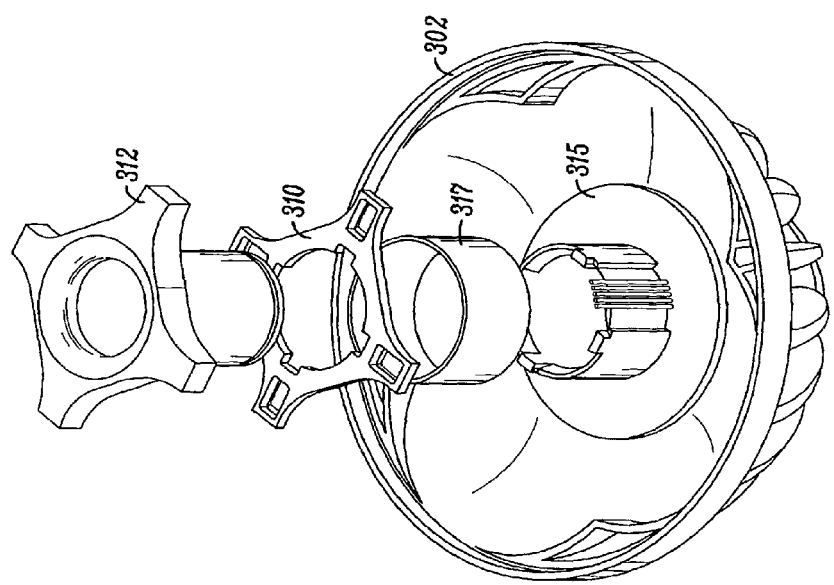
FIG. 37 is an exploded view of a portion of the solid state directional lamp of FIG. 30.

FIGS. 35 and 36 illustrate different views of one implementation of the reflector 304. As described above, the reflector 304 defines an aperture 324 configured to allow the air passageway of the housing to pass through the reflector 304 so that when the solid state directional lamp 300 is assembled, air may flow through the center of the lamp.

In the solid state directional lamps 100, 200 described above, the reflectors 104, 204 define a plurality of geometric curves and a plurality of mirrored portions. In the implementation illustrated in FIGS. 35 and 36, the reflector 304 defines a plurality of geometric curves 326. However, the reflective center collar 317 that is distinct, removable, or separable from the reflector 304 is a mirrored surface that serves as the plurality of mirrored portions. In some implementations, the reflective center collar 317 comprises a flexible fabric-like material, also known as a reflective film, such as WhiteOptics™ produced by WhiteOptics, LLC. In other implementations, the reflective collar 317 comprises material such as Valar produced by Genesis Plastics Technology or any other material that is a highly reflective diffusive white reflector.

Figure 43:
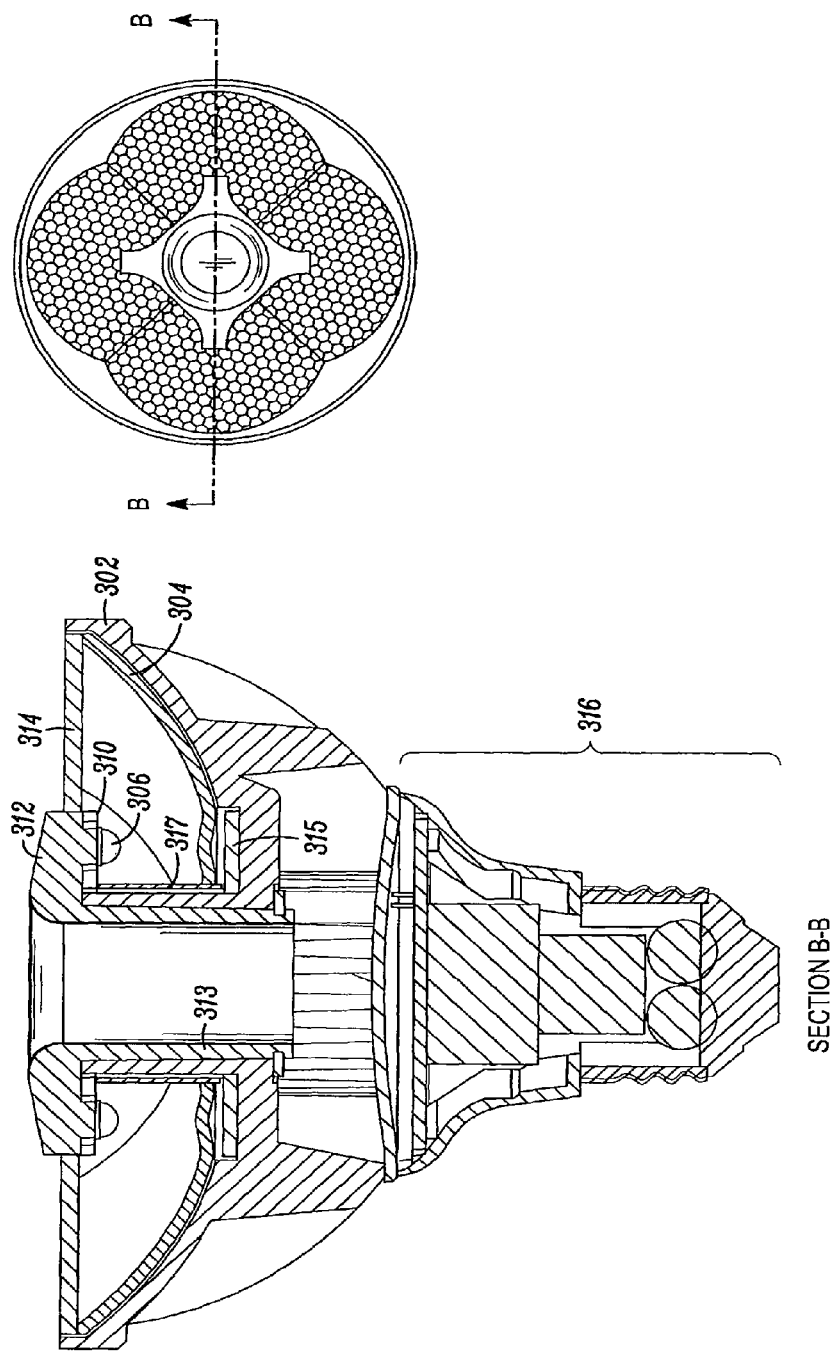
FIG. 43 is a cross sectional view of the solid state directional lamp of FIG. 30.
Figure 44:
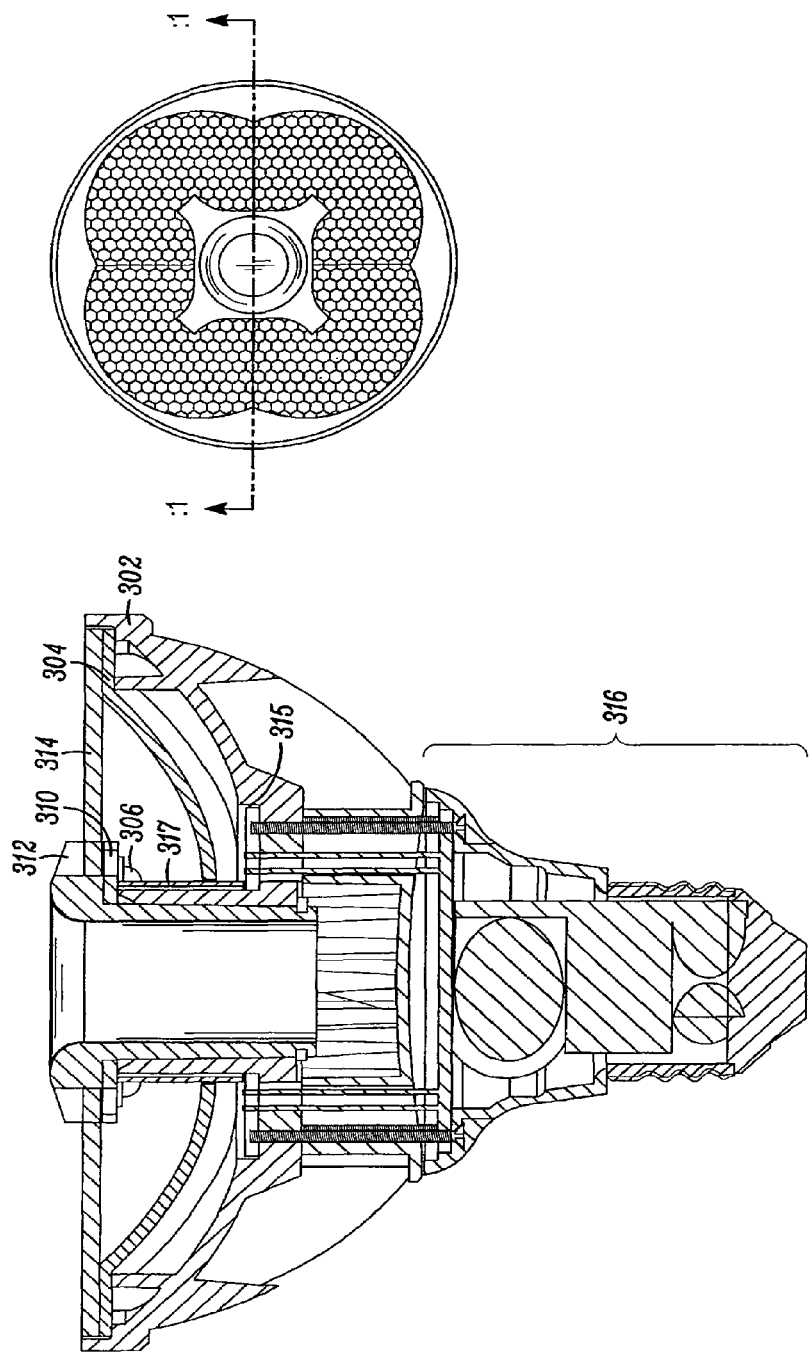
FIG. 44 is another cross sectional view of the solid state directional lamp of FIG. 30.

As shown in FIGS. 30, 43, and 44, when the solid state directional lamp 300 is assembled, the reflective center collar 317 is positioned substantially perpendicular to the plurality of geometric curves 326 of the reflector 304. Due to the positioning of the solid state emitter 306 in the lamp 300 with respect to the reflector 304 and the reflective center collar 317, a light ray emitted from a solid state light emitter 306 that directly impinges a geometric curve 326 is reflected substantially vertically away from the reflector 304 and towards the lens 214 of the lamp 200. Additionally, a light ray that directly impinges the reflective center collar 317 is reflected into a geometric curve 226 of the reflector 304 and reflected substantially vertically away from the reflector 304 towards the lens 314 of the lamp 300.

As shown in FIGS. 35 and 36, in some implementations the reflector 304 may define a plurality of dimples 319. Typically, each dimple of the plurality of dimples 319 is associated with a geometric curve of the plurality of geometric curves 326 and a solid state light emitter 306. A dimple 319 is positioned on a geometric curve 326 below the solid state light emitter 306 to assist in dispersing light rays that the geometric curve 326 would otherwise reflect back into a face of the solid state light emitter 306. In some implementations, a base of one or more dimples of the plurality of dimples 319 is circular in shape. However, in other implementations, a base of one or more dimples of the plurality of dimples 319 has a geometric shape other than a circle.

Figure 40:
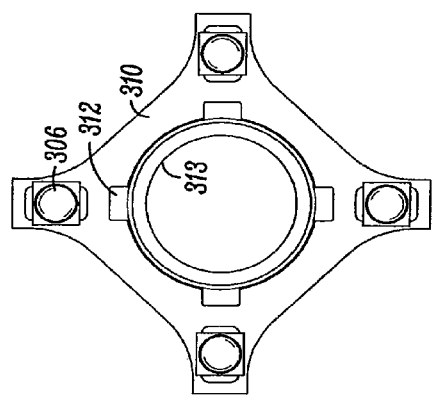
FIG. 40 is a bottom view of the printed circuit board assembled with the metal heat spreader of FIG. 39.
Figure 41:
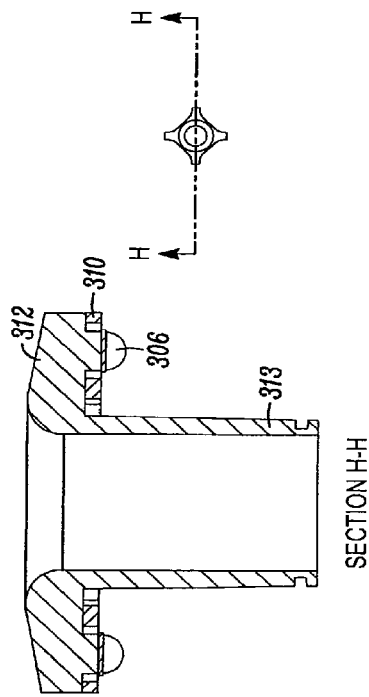
FIG. 41 is a cross sectional view of the printed circuit board assembled with the metal heat spreader of FIG. 39
Figure 39:
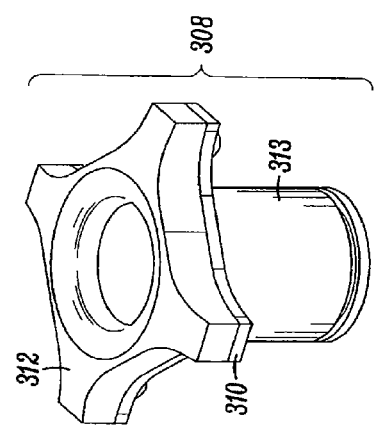
FIG. 39 is a perspective view of another implementation of a printed circuit board assembled with a metal heat spreader of a solid state directional lamp.

FIGS. 39-41 illustrate different views of one implementation of the assembly 308 including the printed circuit board 310 and the metal heat spreader 312. As described above, one or more solid state light emitters 306 may be mounted on the printed circuit board 310 and positioned in the lamp 300 to direct light rays into the reflector 304 and the reflective center collar 317.

Figure 42:
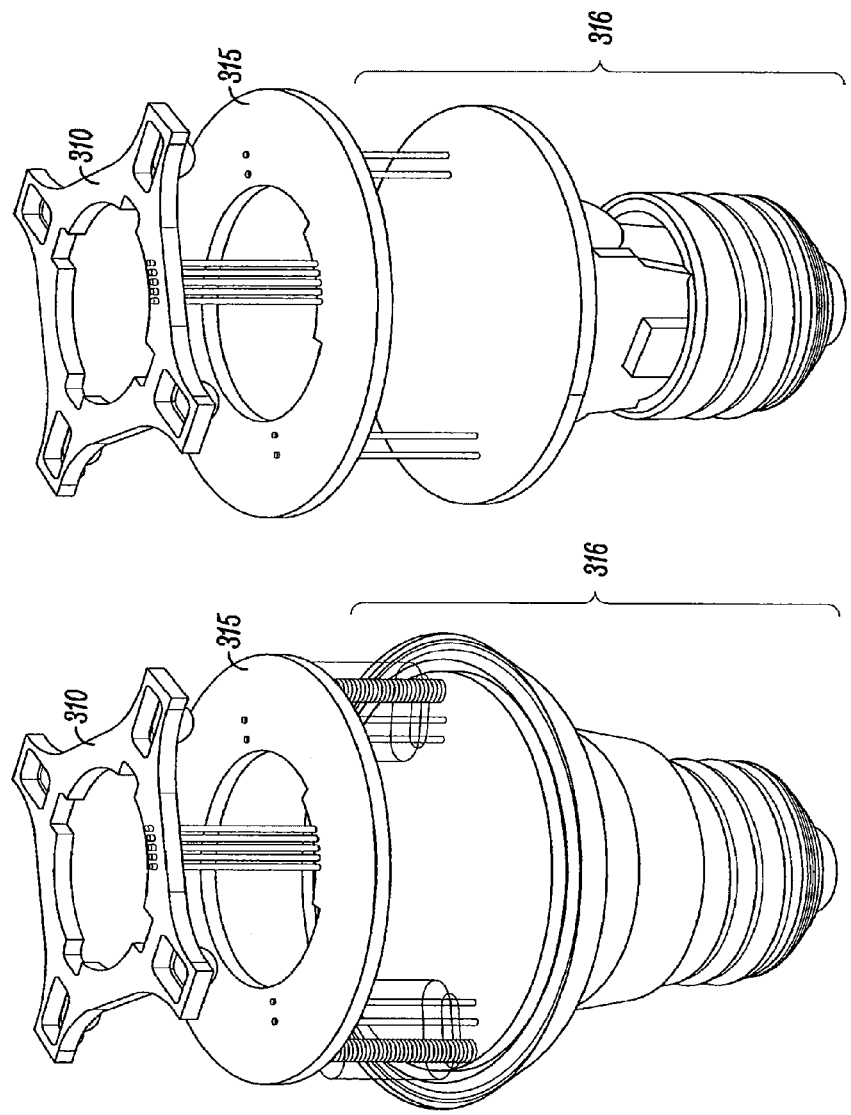
FIG. 42 is a perspective view of a main printed circuit board electrically connected to a second printed circuit board and a power assembly.

In order to reduce the footprint of the printed circuit board 310 so as not to block light that the reflector 304 directs out of the lamp 300, the printed circuit board 310 of the assembly 308 may be electrically connected to the second printed circuit board 315 that is positioned in the housing 302 behind the reflector 304. The second printed circuit board 315 provides additional surface area to mount electrical components used to operate the solid state light emitters 306 that would otherwise be positioned on the printed circuit board 310 of the assembly 308 (also known as the main printed circuit board). As shown in FIGS. 30 and 42, the electrical connection between the printed circuit board 310 of the assembly 308 and the second printed circuit board 315 may be positioned in the lamp 300 between the portion of the housing 302 defining the air passageway 318 and the reflective center collar 317.

As discussed above, in the assembly 308, the metal heat spreader 312 may contact a back of one or more of the solid state light emitters 306 in order to assist in dissipating heat generated by the solid state light emitters 306 when energized. In the implementations illustrated in FIGS. 39-41, the metal heat spreader 312 defines a collar 313 that extends away from the metal heat spreader 312. The collar 313 assists in dissipating heat by providing the metal heat spreader 312 with an increased surface area.

Further, when the solid state directional lamp 300 is assembled, the collar 313 of the metal heat spreader 312 is in communication with the air passageway 318 of the housing 302. Accordingly, it will be appreciated that the airflow passing through the air passageway 318 of the housing operates in conjunction with the collar 313 of the metal heat spreader 312 to provide improved cooling to the lamp 300 when the one or more solid state light emitters 306 are energized.

Figure 45:
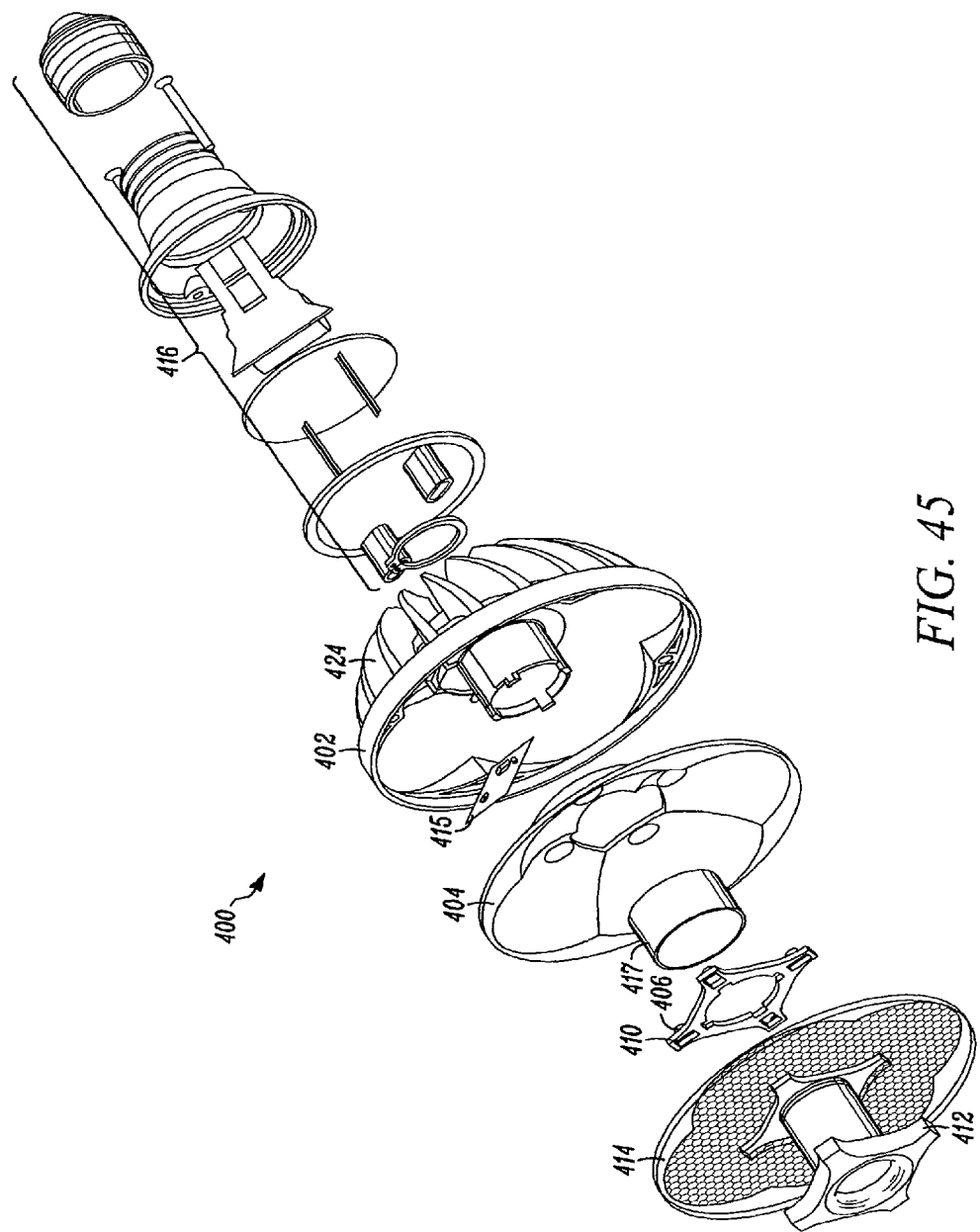
FIG. 45 is an exploded view of another implementation of a solid state directional lamp.

A further implementation of a solid state directional lamp 400 is illustrated in FIGS. 45-50. FIG. 45 is an exploded view of a solid state directional lamp 400. Similar to the solid state lamps 100, 200, 300 described above, the solid state directional lamp 400 may include a housing 402, a reflector 404, a solid state light emitter 406, an assembly 408 including a printed circuit board 410 and a metal heat spreader 412, a lens 414, and a power supply housing 416. Further, similar to the solid state directional lamp 300 described above, the solid state directional lamp 400 may also include a second printed circuit board 415 and a reflective center collar 417.

It should be appreciated that those portions of the solid state directional lamp 400 that correspond to the portions of the solid state directional lamp 100 described above with respect to FIGS. 1-16; that correspond to the portions of the solid state directional lamp 200 described above with respect to FIGS. 17-29; and/or that correspond to the portions of the solid state directional lamp 300 described above with respect to FIGS. 30-44 operate in the solid state directional lamp 400 in the same manner. Accordingly, their operation will not be described in detail below.

As discussed above, the one or more solid state light emitters 406 are positioned in the lamp 400 such that when energized, the one or more solid state light emitters 406 direct light rays toward the reflector 404 positioned in an interior of the housing 402. The reflector 404 directs the received light rays out of the lens 414 and away from the solid state directional lamp 400. Due to the color mixing features integrated within the lens 414, the front face of the solid state directional lamp 400 appears uniform.

Additionally, due to the placement of the one or more solid state light emitters 406 within the solid state directional lamp 400, an air passageway 418 is provided that allows air to flow through the lamp 400. The air passageway 418 assists in providing cooling to the lamp when one or more solid state light emitters 406 positioned adjacent to a perimeter of the air passageway 418 are energized.

Figure 46:
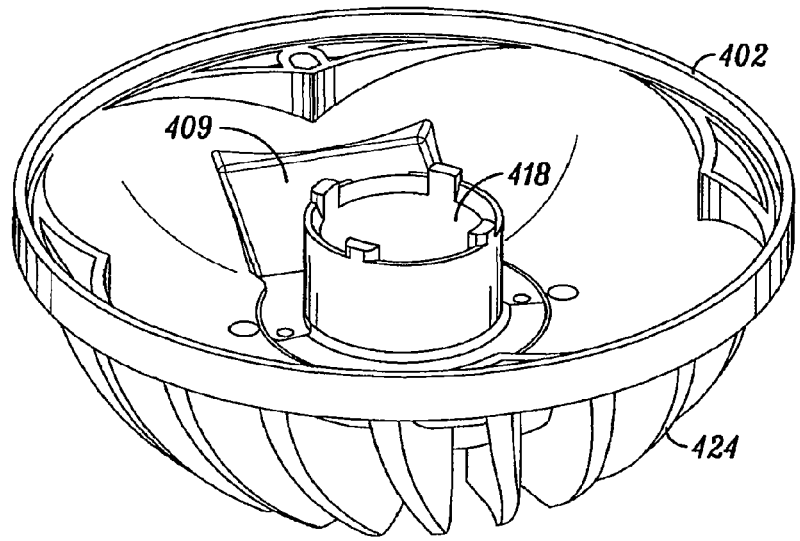
FIG. 46 is perspective view of another implementation of a housing of a solid state directional lamp.
Figure 47:
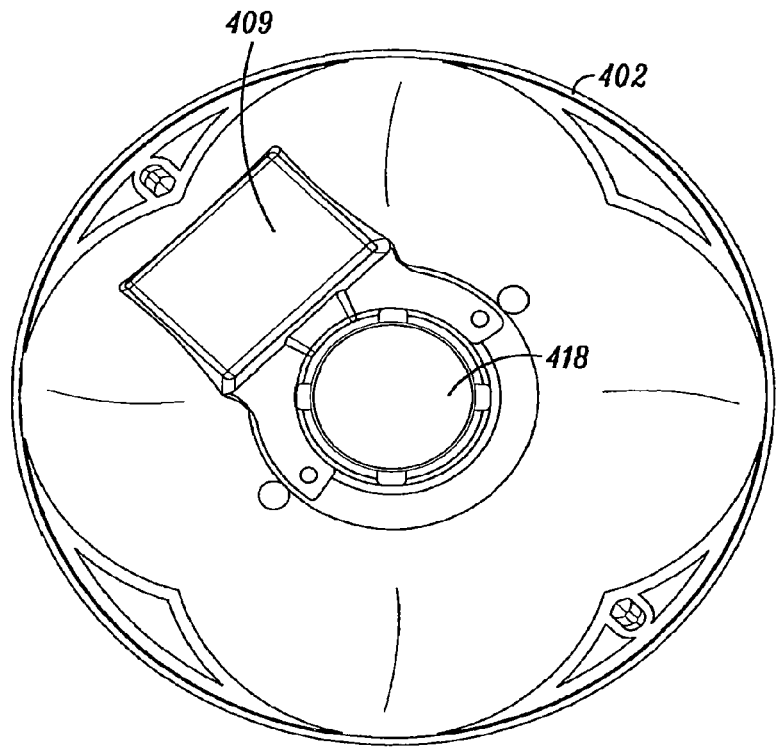
FIG. 47 is a top view of the housing of FIG. 36.

FIGS. 46 and 47 illustrate different views of one implementation of the housing 402. As described above, the housing 302 defines an interior region configured to receive the reflector 304. The housing 402 additionally defines the air passageway 418 that assists in providing cooling to the lamp 400. The housing 402 further defines a plurality of fins 424 that may serve as a heat sink and/or be configured to direct airflow around the housing 402.

The housing 402 additionally defines a recess 409 within the interior region that is configured to receive the second printed circuit board 415 such that when the solid state directional lamp 400 is assembled, the second printed circuit board 415 is positioned in the housing 402 beneath the reflector 404. In contrast to the implementations of the solid state directional lamp 300 described with respect to FIGS. 30-44 where the second printed circuit board 315 is positioned around the portion of the housing 302 defining the air passageway 318, as shown in FIGS. 46-49, the housing 402 defines a recess 409 at a side of the portion of housing 402 defining the air passageway 418 that is configured to receive the second printed circuit board 415.

Referring to FIG. 45, as described above, the reflector 404 defines an aperture 324 configured to allow the air passageway 418 of the housing 402 to pass through the reflector 404 so that when the solid state directional lamp 400 is assembled, air may flow through the center of the lamp.

Similar to the solid state directional lamp 300 described above, the reflector 404 defines a plurality of geometric curves 426 and the reflective center collar 417 that is distinct from the reflector 404 is a mirrored surface that serves as the plurality of mirrored portions. Additionally, the reflector 404 may define a plurality of dimples 419, where each dimple of the plurality of dimples 419 is associated with a geometric curve of the plurality of geometric curves 426 and a solid state light emitter 406.

Figure 49:
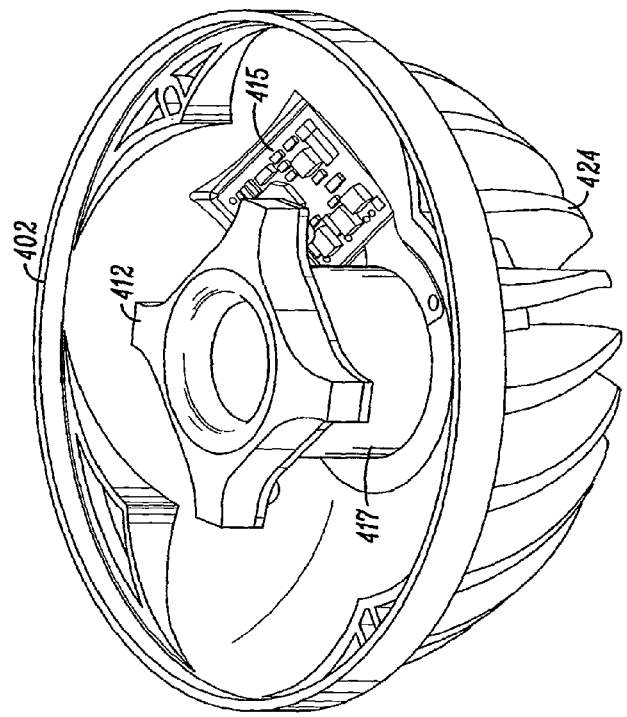
FIG. 49 is a perspective view of the portion of the solid state directional lamp of FIG. 48.
Figure 48:
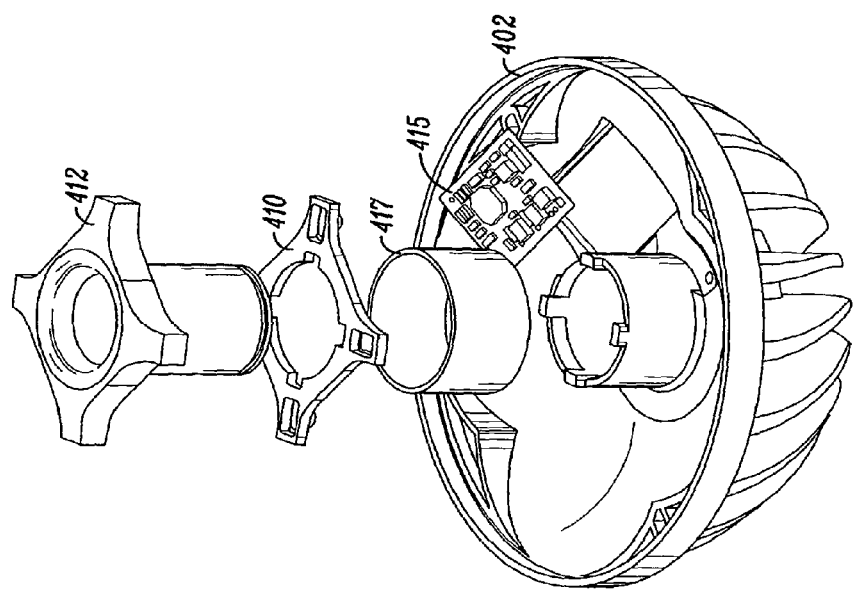
FIG. 48 is an exploded view of a portion of the solid state directional lamp of FIG. 45.
Figure 50:
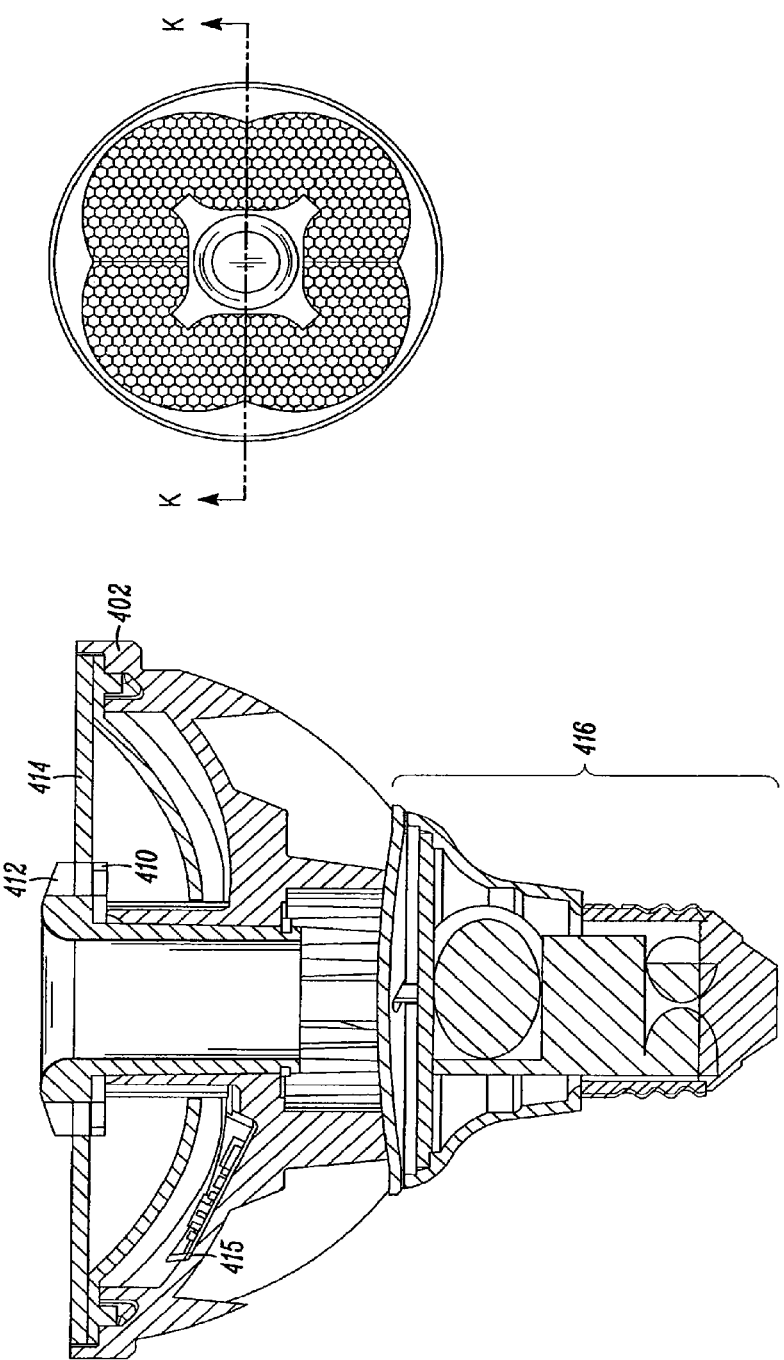
FIG. 50 is a cross sectional view of the solid state directional lamp of FIG. 45.

As shown in FIGS. 45, 48, and 49, when the solid state directional lamp 400 is assembled, the reflective center collar 417 is positioned substantially perpendicular to the plurality of geometric curves 426 of the reflector 404. Due to the positioning of the solid state emitter 406 in the lamp 400 with respect to the reflector 404 and the reflective center collar 417, a light ray emitted from a solid state light emitter 406 that directly impinges a geometric curve 426 is reflected substantially vertically away from the reflector 404 and towards the lens 414 of the lamp 400. Additionally, a light ray that directly impinges the reflective center collar 417 is reflected into a geometric curve 426 of the reflector 404 and reflected substantially vertically away from the reflector 404 towards the lens 414 of the lamp 400.

FIGS. 1-50 teach solid state directional lamp designs that include retroreflective, multi-element lamp optics and a hybrid solid state emitter printed circuit board. As described above, the disclosed solid state directional lamps provide low face brightness and a lack of appearance of individual solid state light emitters on the face of the lamp by utilizing solid state light emitters that direct light into a reflector comprising segmented parabolas and mirrored walls. Further, due to the position of the solid state light emitters within the solid state directional lamp design, an air passageway is provided that allows an airflow through the lamp that provides cooling during operation.

It is intended that the foregoing detailed description be regarded as illustrative rather than limiting, and that it be understood that it is the following claims, including all equivalents, that are intended to define the spirit and scope of this invention.

We claim:

1. A lamp comprising:
   a printed circuit board;
   a metal heat spreader assembled with the printed circuit board; and
   a solid state light emitter positioned on the assembled printed circuit board and metal heat spreader such that the solid state light emitter directs light rays towards an interior of the lamp, wherein the metal heat spreader is configured to conduct heat generated by the solid state light emitter when energized;
   wherein the printed circuit board defines an aperture and at least a portion of the metal heat spreader is positioned in the aperture of the printed circuit board.

2. The lamp of claim 1, wherein the printed circuit board is not thermally conductive.

3. The lamp of claim 2, wherein the printed circuit board is a multilayer FR4 printed circuit board.

4. The lamp of claim 1, wherein the metal heat spreader contacts a back side of the solid state light emitter.

5. The lamp of claim 1, wherein the portion of the metal heat spreader positioned in the aperture of the printed circuit board is in communication with heat dissipation means.

6. The lamp of claim 5, wherein the portion of the metal heat spreader positioned in the aperture of the printed circuit board is in communication with a heat pipe.

7. The lamp of claim 5, wherein the portion of the metal heat spreader positioned in the aperture of the printed circuit board is a solid core of metal.

8. The lamp of claim 5, further comprising:
   a housing defining an air passageway passing through the housing, wherein the air passageway is in communication with the portion of the metal heat spreader positioned in the aperture of the printed circuit board, and wherein the air passageway is configured to providing cooling to the lamp when the solid state light emitter is energized.

9. The lamp of claim 8, wherein the portion of the metal heat spreader positioned in the aperture of the printed circuit board defines one or more fins configured to act as heat sinks.

10. The lamp of claim 1, wherein the solid state light emitter is a single color LED.

11. The lamp of claim 1, wherein the solid state light emitter is a multicolored LED.

12. The lamp of claim 11, wherein the solid state light emitter is a BSY+Red LED.

13. An assembly for use in a lamp, comprising:
a main printed circuit board;
a metal heat spreader assembled with the main printed circuit board;
wherein the assembled main printed circuit board and metal heat spreader are configured to mount a solid state light emitter such that the solid state light emitter directs light rays towards an interior of the lamp;
wherein the main printed circuit board defines an aperture and at least a portion of the metal heat spreader is positioned in the aperture of the main printed circuit board;
wherein the metal heat spreader is configured to conduct heat generated by the solid state light emitter when energized; and
wherein the metal heat spreader is in communication with heat dissipation means.

14. The assembly of claim 13,
wherein the portion of the metal heat spreader positioned in the aperture of the main printed circuit board is in communication with the heat dissipation means.

15. The assembly of claim 13, wherein the portion of the metal heat spreader positioned in the aperture of the main printed circuit board is in communication with a heat pipe.

16. The assembly of claim 13, where the portion of the metal heat spreader positioned in the aperture of the main printed circuit board is a solid core of metal.

17. The assembly of claim 13, wherein the portion of the metal heat spreader positioned in the aperture of the main printed circuit board is configured to be in communication with an air passageway of a housing when the assembly is positioned in the lamp.

18. The assembly of claim 13, wherein the metal heat spreader contacts a back side of the solid state light emitter mounted to assembly.

19. The lamp of claim 13, wherein the main printed circuit board is not thermally conductive.

20. The lamp of claim 19, wherein the main printed circuit board is a multilayer FR4 printed circuit board.

21. The assembly of claim 13, further comprising:
a printed circuit board extension electrically connected to the main printed circuit board;
wherein electronics for driving the solid state light emitter are mounted on the printed circuit board extension.

22. The assembly of claim 21, wherein the printed circuit board extension is positioned in the assembly substantially perpendicular to the main printed circuit board.

23. The assembly of claim 13, wherein the metal heat spreader defines a collar configured to be positioned in an air passageway of a housing when the assembly is positioned in the lamp.

* * * * *